US012632140B2

(12) United States Patent
Zhang et al.

(10) Patent No.: US 12,632,140 B2
(45) Date of Patent: \*May 19, 2026

(54) DISPLAY PANEL AND DISPLAY DEVICE

(71) Applicants:Chengdu BOE Optoelectronics Technology Co., Ltd., Sichuan (CN); BOE Technology Group Co., Ltd., Beijing (CN)

(72) Inventors: Yuanqi Zhang, Beijing (CN); Yu Wang, Beijing (CN); Yi Zhang, Beijing (CN); Shun Zhang, Beijing (CN); Chang Luo, Beijing (CN)

(73) Assignees: Chengdu BOE Optoelectronics Technology Co., Ltd., Chengdu (CN); BOE Technology Group Co., Ltd., Beijing (CN)

( \* ) Notice: Subject to any disclaimer, the term of this patent is extended or adjusted under 35 U.S.C. 154(b) by 0 days.

This patent is subject to a terminal disclaimer.

(21) Appl. No.: 19/184,304

(22) Filed: Apr. 21, 2025

(65) Prior Publication Data

US 2025/0251821 A1 Aug. 7, 2025

Related U.S. Application Data

(63) Continuation of application No. 18/030,031, filed as application No. PCT/CN2022/103083 on Jun. 30, 2022, now Pat. No. 12,299,227.

(51) Int. Cl.
*G06F 3/041* (2006.01)
*G06F 3/044* (2006.01)
(Continued)

(52) U.S. Cl.
CPC ........ *G06F 3/04164* (2019.05); *G06F 3/0412* (2013.01); *G06F 3/0443* (2019.05); (Continued)

(58) Field of Classification Search
CPC .............................. G06F 3/0412; G06F 3/0448
See application file for complete search history.

(56) References Cited

U.S. PATENT DOCUMENTS

2015/0185942 A1* 7/2015 Kim ........................ H10K 59/40
345/173
2016/0315284 A1* 10/2016 Jeon ................... H10K 59/8722
(Continued)

FOREIGN PATENT DOCUMENTS

CN 109164939 A 1/2019
CN 109273486 A 1/2019
(Continued)

OTHER PUBLICATIONS

First Office Action of Chinese Patent Application No. 2022800020510 dated Jul. 19, 2025 with English translation, (13p).

*Primary Examiner* — Nan-Ying Yang
(74) *Attorney, Agent, or Firm* — Arch & Lake LLP

(57) ABSTRACT

A display panel includes: a base substrate; a first touch layer including a first touch line; a touch insulation layer provided with a via hole; and a second touch layer including a second touch line. The second touch line is connected to the first touch line through the via hole; a part of the first touch line and/or the second touch line connected to the functional structure of the display panel forms a connection part. At least one functional structure includes a touch electrode; the first touch line includes a first part and a second part, the second touch line includes a third part and a fourth part, the first part and/or the third part are connected to the touch electrode, and the third part is connected to the first part through at least one via hole.

20 Claims, 11 Drawing Sheets

(51) Int. Cl.
    *H10K 59/124*        (2023.01)
    *H10K 59/40*        (2023.01)

(52) U.S. Cl.
    CPC ........... *H10K 59/124* (2023.02); *H10K 59/40*
        (2023.02); *G06F 3/0446* (2019.05); *G06F*
        *2203/04111* (2013.01)

(56)             References Cited

U.S. PATENT DOCUMENTS

| | | |
|---|---|---|
| 2017/0075452 A1 | 3/2017 | Kim et al. |
| 2018/0158894 A1* | 6/2018 | Park ..................... H10K 59/131 |
| 2019/0036063 A1* | 1/2019 | Lee ....................... G06F 3/0443 |
| 2022/0236849 A1 | 7/2022 | Li et al. |

FOREIGN PATENT DOCUMENTS

| | | |
|---|---|---|
| CN | 110888565 A | 3/2020 |
| CN | 112860123 A | 5/2021 |
| CN | 112947794 A | 6/2021 |
| CN | 113377229 A | 9/2021 |
| CN | 113728296 A | 11/2021 |
| CN | 113964109 A | 1/2022 |
| CN | 114489388 A | 5/2022 |

* cited by examiner

542(7)

56

711

5211/5411   5311
5212/5412
521/541

542(7)

56   56

712

5211/5411   5313   5313   5312
5212/5412
521/541

DISPLAY PANEL AND DISPLAY DEVICE

CROSS REFERENCE

The present application is a continuation of U.S. application Ser. No. 18/030,031, which is a National Stage of International Application No. PCT/CN2022/103083 filed on Jun. 30, 2022, the entire contents of which are incorporated herein by reference for all purposes.

TECHNICAL FIELD

The present disclosure relates to the field of display technology, and in particular, to a display panel and a display device.

BACKGROUND

Organic light-emitting diode (OLED) display panel has become a mainstream development direction in the field of display technology due to its advantages of self-illumination, high brightness, good image quality, and low energy consumption. On cell technology will gradually replace the existing touch screen pane (TSP) plug-in mode. On cell technology is a touch display integration technology, which uses photolithography process to form touch electrodes and lines on the encapsulation layer.

It should be noted that the information disclosed in the above background section is only for enhancing the understanding of the background of the present disclosure, and therefore may include information that does not constitute the related art known to those of ordinary skill in the art.

SUMMARY

According to an aspect of the present disclosure, there is provided a display panel including a display region and a non-display region located on at least one side of the display region, where the display panel includes:

a base substrate;

a first touch layer, provided on a side of the base substrate, where the first touch layer includes a first touch line, and the first touch line is at least partially located in the non-display region;

a touch insulation layer, provided on a side of the first touch layer away from the base substrate, where the touch insulation layer is provided with at least one via hole, and the via hole is at least partially located in the non-display region;

a second touch layer, provided on a side of the touch insulation layer away from the base substrate, where the second touch layer includes a second touch line, and a resistance per unit length of the second touch line is different from a resistance per unit length of the first touch line, the second touch line is at least partially located in the non-display region, an orthographic projection of the second touch line on the base substrate at least partially overlaps with the an orthographic projection of the first touch line on the base substrate, and the second touch line is connected to the first touch line through the via hole;

where, a part of the first touch line and/or the second touch line connected to at least one functional structure of the display panel forms a connection part, and the at least one via hole is at least located on a side of the connection part away from the functional structure.

In at least one embodiment of the present disclosure, the at least one functional structure includes:

a touch electrode, connected to the first touch line and/or the second touch line and located in the display region, where a connection part between the touch electrode and the first touch line and/or the second touch line is provided with a start point and an end point.

In at least one embodiment of the present disclosure, the at least one via hole includes: a first via hole, located on a side of the start point away from the end point.

In at least one embodiment of the present disclosure, the at least one via hole further includes:

a second via hole, where the second via hole is located on a side of the end point close to the start point.

In at least one embodiment of the present disclosure, an orthographic projection of the second via hole on the base substrate at least partially overlaps with an orthographic projection of the end point on the base substrate.

In at least one embodiment of the present disclosure, the at least one via hole further includes:

at least one third via hole, located between the first via hole and the second via hole.

In at least one embodiment of the present disclosure, the first touch line includes:

a first part;

a second part, connected to the first part, where a width of the second part is smaller than a width of the first part;

the second touch line includes:

a third part, where an orthographic projection of the third part on the base substrate at least partially overlaps with an orthographic projection of the first part on the base substrate;

a fourth part, connected to the third part, where an orthographic projection of the fourth part on the base substrate at least partially overlaps an orthographic projection of the second part on the base substrate, and a width of the fourth part is smaller than a width of the third part;

where, the first part and/or the third part are connected to the touch electrode, and the third part is connected to the first part through the first via hole, the second via hole and the third via hole.

In at least one embodiment of the present disclosure, the first part and/or the third part are connected to an edge of the touch electrode close to the non-display region, and a plurality of first parts and/or a plurality of third parts are located on a same line (parallel to each other).

In at least one embodiment of the present disclosure, the touch electrode is a touch driving electrode or a touch sensing electrode, and the touch electrode is provided in the second touch layer.

In at least one embodiment of the present disclosure, the non-display region includes a peripheral region, a bending region and a bonding region, the peripheral region is closer to the display region, the bonding region is more far away from the display region, and the bending region is located between the peripheral region and the bonding region; the display panel further includes:

a display substrate, provided between the base substrate and the first touch layer, where the display substrate includes a source-drain layer, the source-drain layer includes a connection wire, the connection wire is provided in the bending region and extends to the peripheral region and the bonding region, and the connection wire is the at least one functional structure.

In at least one embodiment of the present disclosure, the at least one via hole further includes:

a fourth via hole, located in the peripheral region and provided close to the bending region, where the second touch line is connected to the first touch line through the fourth via hole.

In at least one embodiment of the present disclosure, the touch insulation layer is further provided with a first adapter hole, and the first adapter hole is located in the peripheral region and is provided close to the bending region, the second touch line is connected to the connection wire through the first adapter hole, and the first adapter hole is located on a side of the fourth via hole close to the bending region.

In at least one embodiment of the present disclosure, the first touch line further includes:

a fifth part, provided in the bonding region;

the second touch line further includes:

a sixth part, provided in the bonding region, where an orthographic projection of the sixth part on the base substrate at least partially overlaps with an ortho- graphic projection of the fifth part on the base substrate;

the touch insulation layer is further provided with a second adapter hole, the second adapter hole is located in the bonding region and is provided close to the bending region, and the sixth part is connected to the connection wire through the second adapter hole.

In at least one embodiment of the present disclosure, the at least one via hole further includes:

a fifth via hole, located in the bonding region and pro- vided close to the bending region, where the sixth part is connected to the fifth part through the fifth via hole, and the second adapter hole is located on a side of the fifth via hole close to the bending region.

In at least one embodiment of the present disclosure, the display panel further includes:

a bonding pin, located in the bonding region;

where the touch insulation layer is further provided with a third adapter hole, the third adapter hole is connected to the bonding pin, the sixth part is connected to the connection wire through the third adapter hole, and the bonding pin is the at least one functional structure.

In at least one embodiment of the present disclosure, the at least one via hole further includes:

a sixth via hole, located in the bonding region and provided close to the bonding pin, where the sixth part is connected to the fifth part through the sixth via hole, and the sixth via hole is located on a side of the third adapter hole close to the bending region.

In at least one embodiment of the present disclosure, an extending direction of the bonding pin intersects with an extending direction of the sixth part.

In at least one embodiment of the present disclosure, the display substrate includes:

an active layer, provided on a side of the base substrate;

a gate insulation layer, provided on a side of the active layer away from the base substrate;

a gate, provided on a side of the gate insulation layer away from the base substrate;

an interlayer dielectric layer, provided on a side of the gate away from the base substrate;

a first source-drain layer, provided on a side of the interlayer dielectric layer away from the base substrate, where the first source-drain layer includes a source and a drain, and the source and the drain are electrically connected to the active layer;

a planarization layer, provided on a side of the first source-drain layer away from the base substrate;

a second source-drain layer, provided on a side of the planarization layer away from the base substrate, where the second source-drain layer includes a connection structure and the connection wire, the connection struc- ture and the connection wire are provided at intervals, and the connection structure is electrically connected to the source or the drain; and a passivation layer, provided on a side of the second source-drain layer away from the base substrate.

In at least one embodiment of the present disclosure, the display substrate further includes:

a first electrode, provided on a side of the passivation layer away from the base substrate, where the first electrode is electrically connected to the connection structure;

a pixel definition layer, provided on a side of the first electrode away from the base substrate, where the pixel definition layer is provided with an opening part;

a light-emitting layer group, provided on a side of the pixel definition layer away from the base substrate and at least partially located within the opening part;

a second electrode, provided on a side of the light- emitting layer group away from the base substrate; and an encapsulation layer group, provided on a side of the second electrode away from the base substrate, where the first touch layer is provided on a side of the encapsulation layer group away from the base sub- strate.

According to another aspect of the present disclosure, there is provided a display device, which includes the display panel described in any one of the above.

It is to be understood that both the above general descrip- tion and the following detailed description are exemplary and explanatory only and are not restrictive of the present disclosure.

BRIEF DESCRIPTION OF THE DRAWINGS

The accompanying drawings, which are incorporated in and constitute a part of the description, illustrate embodi- ments consistent with the present disclosure, and are used to explain the principles of the present disclosure together with the description. Obviously, the drawings in the following description are some embodiments of the present disclosure, and for those of ordinary skill in the art, other drawings can also be obtained from these drawings without creative efforts.

EXPLANATION OF THE REFERENCE NUMBERS

Figures 1, 2:
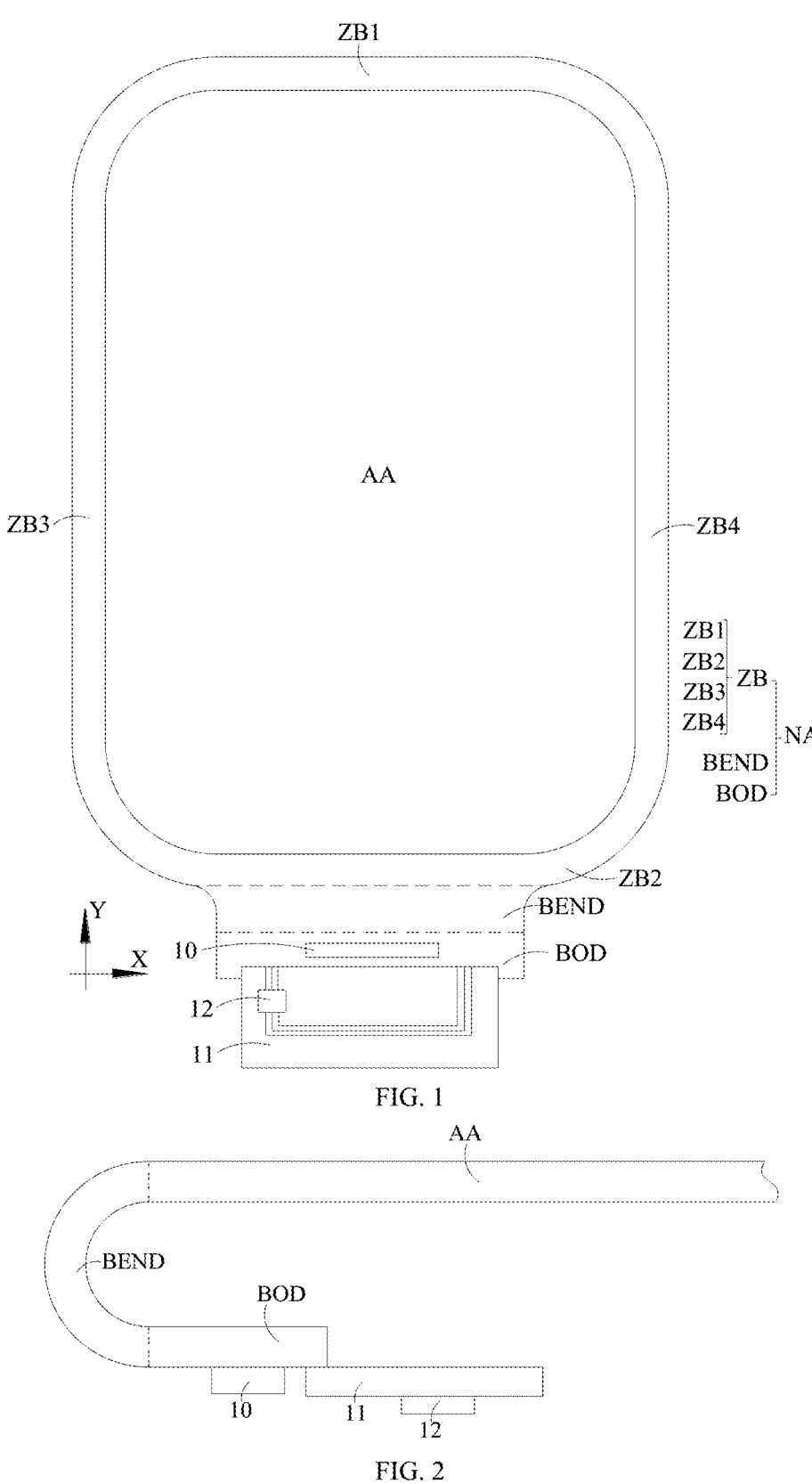
FIG. 1 is a schematic structural diagram of the region division of the display panel in the present disclosure.
FIG. 2 is a schematic structural diagram of the display panel in FIG. 1 after bending.

1. Base substrate;

2. Driving backplane; 21. Shading layer; 22. Buffer layer; 23. Active layer; 24. Gate insulation layer; 25. Gate; 26. Interlayer dielectric layer; 27. First source-drain layer; 271. Source; 272. Drain; 273. Connection wire; 28. Passivation layer; 29. Planarization layer; 30. Second source-drain layer; 301. Connection structure;

3. Light-emitting substrate; 31. First electrode; 32. Pixel definition layer; 33. Light-emitting layer group; 34. Second electrode;

4. Encapsulation layer group;

5. Touch layer group; 51. Barrier layer;

52. The first touch layer; 521. The first touch line; 5211. The first part; 5212. The second part; 5213. The fifth part;

53. Touch insulation layer; 531. Via hole; 5311. First via hole; 5312. Second via hole; 5313. Third via hole; 5314. Fourth via hole; 5315. Fifth via hole; 5316. Sixth via hole; 5317. First adapter hole; 5318. Second adapter hole; 5319. Third adapter hole;

54. Second touch layer; 541. Second touch line; 5411. Third part; 5412. Fourth part; 5413. Sixth part; 542. Touch electrode; 55. Protection layer; 56. Touch pattern; 561, Dummy part;

61. Touch detection electrode; 611. First touch unit; 6111. First touch electrode; 6112. First connection part; 612. Second touch unit; 6121. Second touch electrode; 6122. Second connection part; 62. Touch detection lead; 621. First touch detection lead; 622. Second touch detection lead;

7. Functional structure; 71. Connection part; 711. Start point; 712. End point;

75. Bonding pin;

8. Polarizer; 9. Cover plate; 10. Display driving chip; 11. Flexible printed circuit board; 12. Touch driving chip; AA. Display region; NA. Non-display region; ZB. Peripheral region; ZB1. First peripheral region; ZB2. Second peripheral region; ZB3. Third peripheral region; ZB4. Fourth peripheral region; BEND. Bending region; BOD. Bonding region;

X. First direction; Y Second direction.

DETAILED DESCRIPTION

Example embodiments will now be described more fully with reference to the accompanying drawings. Example embodiments, however, can be implemented in various forms and should not be construed as limited to the embodiments set forth here; by contrast, these embodiments are provided so that the present disclosure will be thorough and complete, and will fully convey the concept of example embodiments to those skilled in the art. The same reference numbers in the drawings denote the same or similar structures, and thus their detailed descriptions will be omitted. Furthermore, the drawings are merely schematic illustrations of the present disclosure and are not necessarily drawn to scale.

Although relative terms such as "upper" and "lower" are used in the description to describe the relative relationship of one component to another component shown in the drawings, these terms are used in the description only for convenience, for example, according to the directions shown in the accompanying drawings. It will be appreciated that if the device shown in the drawings is turned over so that it is upside down, then component described as being "upper" will become the component that are "lower". When a structure is "on" another structure, it may mean that a structure is integrally formed on another structure, or that a structure is "directly" placed on another structure, or that a structure is "indirectly" placed on another structure through another structure.

The terms "a", "an", "the", "said" and "at least one" are used to indicate the presence of one or more elements/components/etc.; the terms "comprising" and "including" are used to indicate an open inclusion and means that there may be additional elements/components/etc. in addition to the listed elements/components/etc.; the terms "first", "second" and "third" etc. are only used as a marker, not a limit on the number of its objects.

In the present disclosure, unless otherwise specified and limited, the term "connection" should be understood in a broad sense, for example, "connection" can be a fixed connection, a detachable connection, or an integral body; it can be a direct connection, or it can be connected indirectly through an intermediary. "And/or" is just an association relationship describing associated objects, which means that there can be three kinds of relationships, for example, A and/or B can mean the following three situations: A exists alone, A and B exist at the same time, and B exists alone. In addition, the character "/" in the context generally indicates that the contextual objects are an "or" relationship.

According to embodiments of the present disclosure, there is provided a display panel, as shown in FIGS. 1-15. The display panel includes a display region AA and a non-display region NA located on at least one side of the display region AA, the display panel may include a base substrate 1, a first touch layer 52, a touch insulation layer 53 and a second touch layer 54; the first touch layer 52 is provided on a side of the base substrate 1, the first touch layer 52 includes a touch line 521, and the first touch line 521 is at least partially located in the non-display region NA; the touch insulation layer 53 is provided on a side of the first touch layer 52 away from the base substrate 1, the touch insulation layer 53 is provided with at least one via hole 531, and the via hole 531 is at least partially located in the non-display region NA; the second touch layer 54 is provided on a side of the touch insulation layer 53 away from the base substrate 1, the second touch layer 54 includes a second touch line 541, the resistance per unit length of the second touch line 541 is different from the resistance per unit length of the first touch line 521, the second touch line 541 is at least partially located in the non-display region NA, the orthographic projection of the second touch line 541 on the base substrate 1 at least partially overlaps with the ortho-graphic projection of the first touch line 521 on the base substrate 1, and the second touch line 541 is connected with the first touch line 521 through the via hole 531; among them, a part of the first touch line 521 and/or the second touch line 541 connected to at least one functional structure 7 of the display panel forms a connection part 71, and at least one via hole 531 is at least located on a side of the connection part 71 away from the functional structure 7.

In the display panel of the present disclosure, on the one hand, at least part of the peripheral touch detection leads 62 are provided as a double-layer structure including the first touch line 521 and the second touch line 541, and the first touch line 521 is connected to the second touch line 541 through the via hole 531, which reduces the resistance of the peripheral touch detection leads 62 and improves the touch effect.

On the other hand, the first touch line 521 and/or the second touch line 541 are connected to the functional structure 7 of the display panel to form a connection part 71, and the via hole 531 is at least located on a side of the connection part 71 away from the functional structure 7, so that, even if in the case that the attenuation degree of the same touch driving signal in the first touch line 521 is inconsistent with that in the second touch line 541 due to the fact that the resistance per unit length of the second touch line 541 is different from the resistance per unit length of the first touch line 521, the touch driving signals input to the functional structure 7 can be made to be consistent by merging the touch driving signal on the first touch line 521 and the touch driving signal on the second touch line 541 at the via hole 531; moreover, the touch sensing signal output from the functional structure 7 is transmitted to the first touch line 521 and the second touch line 541 at the same time, ensuring that the initial data of the touch sensing signal transmitted on the first touch line 521 is consistent with the initial data of the touch sensing signal transmitted on the second touch line 541.

On another hand, in the same way, the consistency of the touch sensing signal and the touch driving signal on the first touch line 521 and the second touch line 541 in the entire transmission process is ensured to avoid different touch sensing signals and touch driving signals being transmitted to the functional structure 7 of the display panel, thus avoid affecting the touch effect.

Referring to FIG. 1, the display panel may include a display region AA for displaying images and a non-display region NA that does not display images, and a touch function may be implemented in the display region AA. The non-display region NA may include a peripheral region ZB which may be arranged to surround the display region AA; and it may also include a bending region BEND for bending and a bonding region BOD for bonding. The bending region BEND is connected to the peripheral region ZB, and the bonding region BOD is connected to the bending region BEND.

The peripheral region ZB may include a first peripheral region ZB1, a second peripheral region ZB2, a third peripheral region ZB3, and a fourth peripheral region ZB4. The first peripheral region ZB1 and the second peripheral region ZB2 are provided on two opposite sides of the display region AA in the second direction Y The third peripheral region ZB3 and the fourth peripheral region ZB4 are provided on two opposite sides of the display region AA in the first direction X. A bonding region BOD is provided on the side of the second peripheral region ZB2 away from the display region AA. Specifically, the bending region BEND is con-nected to the second peripheral region ZB2, and the bonding region BOD is connected to the bending region BEND, that is, the bending region BEND is connected between the bonding region BOD and the second peripheral region ZB2.

Referring to FIG. 2, the display panel can be bent at the bending region BEND, so that the bonding region BOD is bent at the side of the display region AA away from the display surface.

Figure 4:
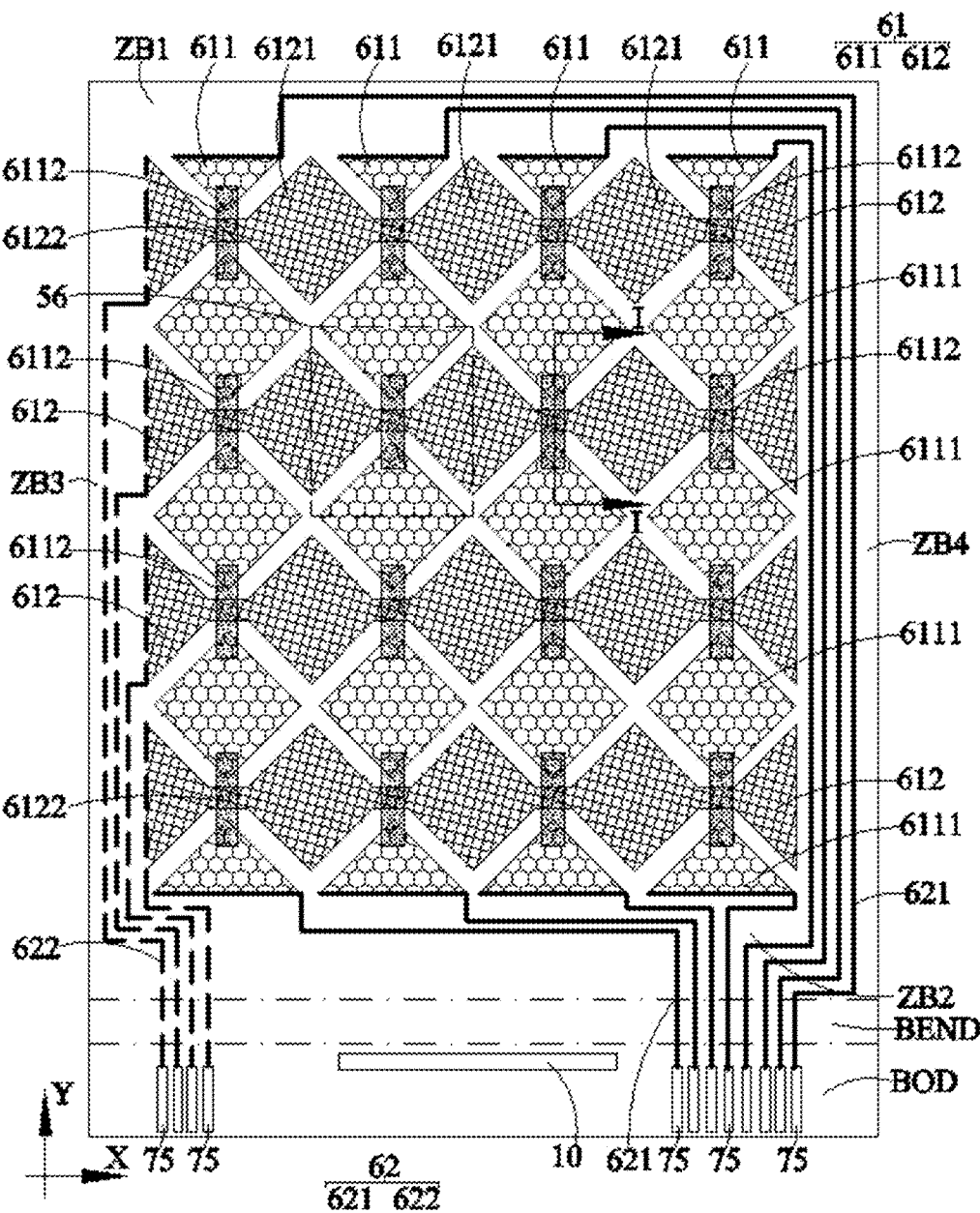
FIG. 4 is a schematic structural diagram from top view of some embodiments of the touch layer group of the display panel in the present disclosure.
Figure 5:
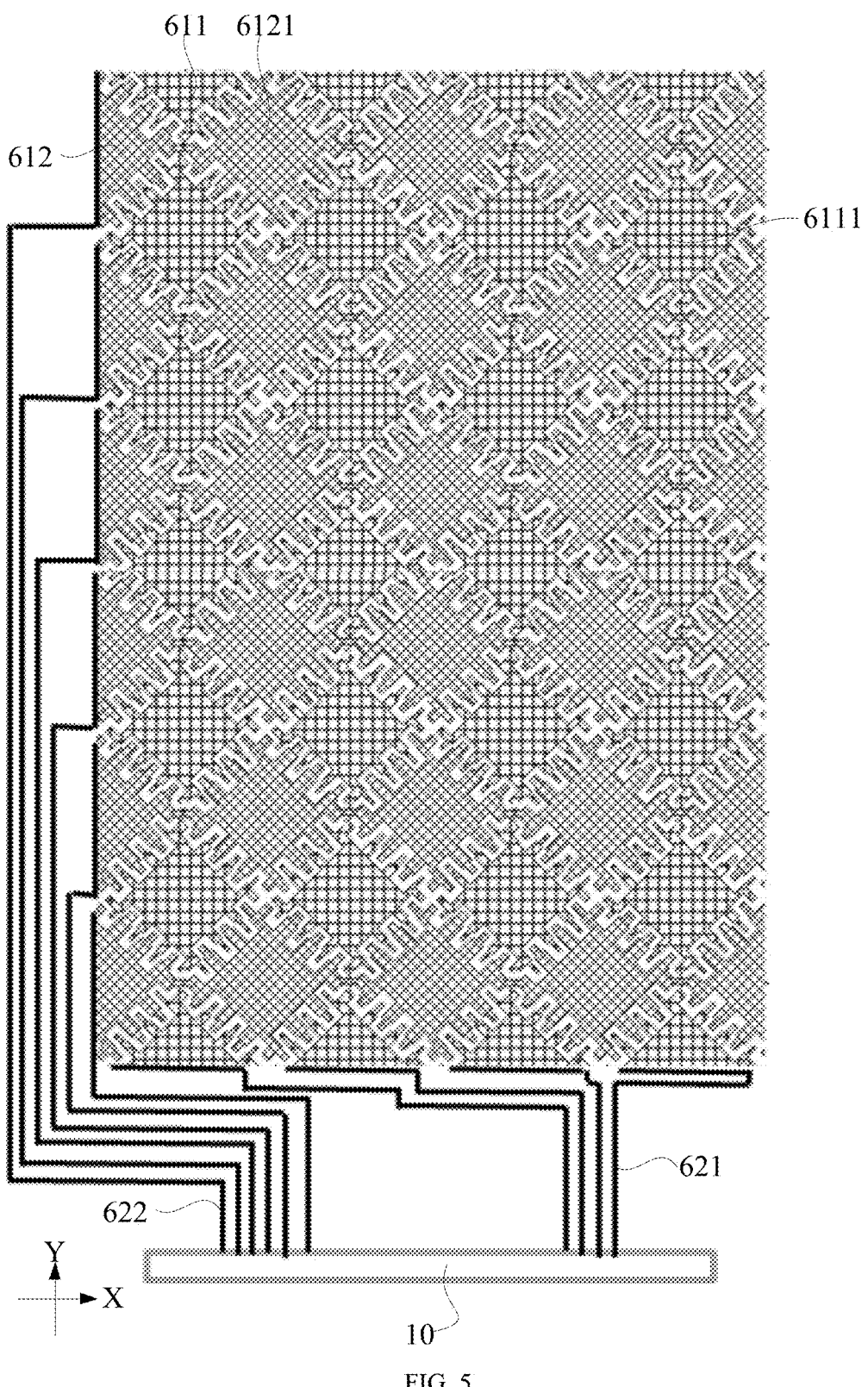
FIG. 5 is a schematic structural diagram from top view of some embodiments of the touch layer group of the display panel in the present disclosure.

Referring to FIG. 1, FIG. 4 and FIG. 5, bonding pins 75 are provided in the bonding region BOD, and external devices can be mounted (or attached) on the bonding pins 75. The external devices may include a display driving chip 10, a touch driving chip 12, a flexible printed circuit board 11 or a rigid printed circuit board and the like. In addition, chip on flex (or, chip on film, COF), connectors and the like can also be mounted on the bonding pins 75 as external devices. One external device or more than one external device may be mounted in the bonding region BOD. The display driving chip 10 may be disposed in the bonding region BOD of the display panel, and a printed circuit board may be attached to an end of the bonding region BOD. In this case, the display panel may include bonding pins 75 connected to the display driving chip 10 and bonding pins 75 connected to the printed circuit board. In another embodi-ment, the display driving chip 10 may be mounted on a chip on film, and the chip on film may be attached to the bonding region BOD of the display panel.

Referring to FIG. 1, the display driving chip 10 may be mounted on a surface of the display panel the same as the display surface. The touch driving chip 12 can be mounted on the surface of the flexible printed circuit board 11 the same as the display surface. Referring to FIG. 2, when the bending region BEND is bent in reverse, the display driving chip 10 and the touch driving chip 12 are located on the side of the display panel away from the display surface.

The touch driving chip 12 can be adhered to the flexible printed circuit board 11 through an anisotropic conductive adhesive, or can be attached to the flexible printed circuit board 11 through ultrasonic engaging. The width of the flexible printed circuit board 11 in the first direction X may be smaller than the width of the display panel in the first direction X. The width of the touch driving chip 12 in the first direction X may be smaller than the width of the flexible printed circuit board 11 in the first direction X.

The touch driving chip 12 may include an integrated circuit for driving the touch layer group 5. In an embodi-ment, the integrated circuit may be a touch driving inte-grated circuit that generates and provides touch driving signals, but the invention is not limited to this. The touch driving chip 12 is connected to the bonding pin 75 of the display panel, so as to provide the touch driving signal to the bonding pin 75 and receive the touch sensing signal fed back by the touch layer group 5.

Figure 3:
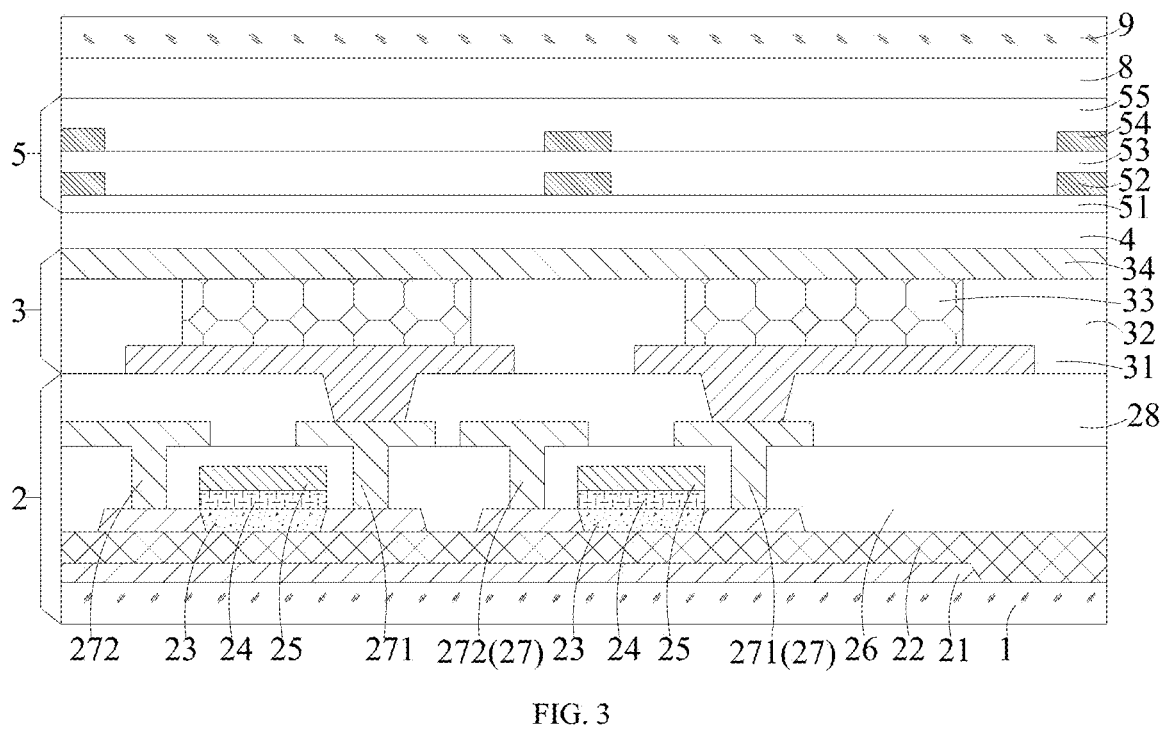
FIG. 3 is a schematic structural sectional diagram of some embodiments within the display region of the display panel in FIG. 1.

Referring to FIG. 3, the display panel may include a display substrate, and the display substrate may include a driving backplane 2 and a light-emitting substrate 3. The driving backplane 2 is provided on a side of the base substrate 1, and the light-emitting substrate 3 is provided on the side of the driving backplane 2 away from the base substrate 1; a touch layer group 5 can be provided on the light-emitting side of the display substrate, that is, the touch layer group 5 is provided on the side of the light-emitting substrate 3 away from the base substrate 1; A polarizer 8 may be provided on the side of the touch layer group 5 away from the display substrate, and a cover plate 9 may be provided on the side of the polarizer 8 away from the display substrate.

The display substrate can be an OLED (Organic Light-emitting Diode) display substrate, a QLED (Quantum Dot Light-emitting Diode) display substrate, etc.; the display substrate has a light-emitting side and a non-light-emitting side, the light-emitting side and the non-light-emitting side are provided opposite to each other, a screen can be displayed on the light-emitting side, and the side for displaying the screen is the display surface. OLED display substrates have the characteristics of self-illumination, high brightness, wide viewing angle, fast response time, and that R, G, and B full-color components can be produced, so they are regarded as star products for next-generation displays.

The OLED is taken as an example for description below.

Referring to FIG. 3, the display substrate may include a driving backplane 2 and a light-emitting substrate 3, the driving backplane 2 may include a plurality of driving circuits arranged in an array, the light-emitting substrate 3 may include a plurality of light-emitting devices arranged in an array, and the driving circuit can drive the light-emitting device to emit light.

In the example embodiments, as shown in FIG. 3, the display substrate may include a base substrate 1, and the material of the base substrate 1 may include an inorganic material, for example, the inorganic material may be glass, quartz, or metal, etc. The material of the base substrate 1 may also include an organic material, for example, the organic material may be resin materials such as polyimide, polycarbonate, polyacrylate, polyetherimide, polyether-sulfone, polyethylene terephthalate and polyethylene naphthalate. The base substrate 1 may be formed of a plurality of material layers, for example, the base substrate 1 may include a plurality of base layers, and the material of the base layer may be any one of the above-mentioned materials. The base substrate 1 can also be provided as a single layer, which can be any one of the above materials.

A light-shielding layer 21 may also be provided on a side of the base substrate 1, and the light incident from the base substrate 1 into the active layer 23 will generate photocarriers in the active layer 23, thereby greatly affecting the characteristics of the thin film transistor, which ultimately affects the display quality of the display device; the light incident from the base substrate 1 can be blocked by the light-shielding layer 21, so as to avoid affecting the characteristics of the thin film transistor and the display quality of the display device.

A buffer layer 22 can also be formed on the side of the light-shielding layer 21 away from the base substrate 1. The buffer layer 22 plays the role of blocking water vapor and impurity ions in the base substrate 1 (especially organic materials), and plays the role of increasing the hydrogen ions for the active layer 23 formed subsequently. The material of the buffer layer 22 is an insulation material, which can insulate and isolate the light-shielding layer 21 from the active layer 23.

The active layer 23 is provided on a side of the buffer layer 22 away from the base substrate 1. The active layer 23 may include a channel part and conductor parts provided at both ends of the channel part. A gate insulation layer 24 is provided on a side of the active layer 23 away from the base substrate 1, a gate 25 is provided on a side of the gate insulation layer 24, and an interlayer dielectric layer 26 is provided on a side of the gate 25 away from the base substrate 1. The interlayer dielectric layer 26 is provided with a through hole, and the through hole is connected to the conductor part. A first source-drain layer 27 is provided on the side of the interlayer dielectric layer 26 away from the base substrate 1. In the display region AA, the source-drain layer 27 may include a source 271 and a drain 272, and the source 271 and the drain 272 are respectively connected to two conductor parts correspondingly through two through holes. A passivation layer 28 is provided on the side of the source 271 and the drain 272 away from the base substrate 1, a through hole is provided in the passivation layer 28, and the through hole is connected to the source 271. The active layer 23, the gate 25, the source 271 and the drain 272 form a thin film transistor.

Figure 16:
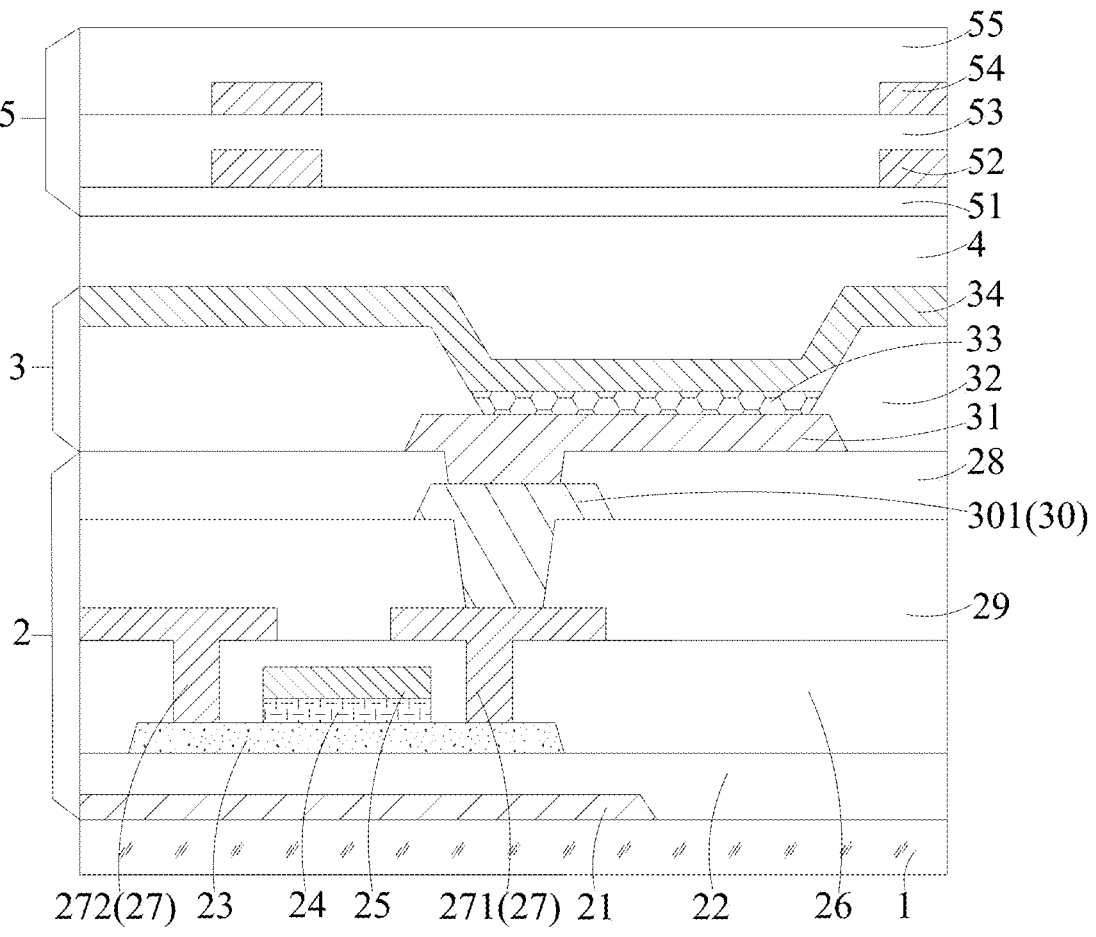
FIG. 16 is schematic structural sectional diagram of some embodiments within the display region of the display panel in FIG. 1.

Referring to FIG. 16, in other example embodiments of the present disclosure, a planarization layer 29 is provided on the side of the first source-drain layer 27 away from the base substrate 1, and a via hole is also provided in the planarization layer 29. A second source-drain layer 30 is provided on the side of the planarization layer 29 away from the base substrate 1. In the display region AA, the second source-drain layer 30 may include a connection structure 301, and the connection structure 301 is connected to the source 271 through the via hole on the planarization layer 29. A third source-drain layer, a fourth source-drain layer, and the like may also be provided as needed.

It should be noted that the thin film transistor described in the description is a top-gate thin film transistor. In other example embodiments of the present disclosure, the thin film transistor may also be a bottom-gate or double-gate type, and the specific structure of them will not be repeatedly described here. Furthermore, when using thin film transistors with opposite polarities or when the direction of current changes during circuit operation, the functions of the "source 271" and "drain 272" may be interchanged at some times. Therefore, in the description, "source 271" and "drain 272" can be interchanged with each other.

Continuing to refer to FIG. 3 and FIG. 16, a light-emitting substrate 3 is provided on the side of the passivation layer 28 away from the base substrate 1, and the light-emitting substrate 3 may include a first electrode 31, a pixel definition layer 32, a light-emitting layer group 33 and a second electrode 34.

Specifically, the first electrode 31 is provided on the side of the passivation layer 28 away from the base substrate 1, and the first electrode 31 is connected to the source 271 of the driving backplane 2 by means of a through hole, and the first electrode 31 may be an anode (pixel electrode).

A pixel definition layer 32 is provided on the side of the first electrode 31 away from the base substrate 1, an opening part is provided within the pixel definition layer 32, and the light-emitting layer group 33 is provided in the opening part. The second electrode 34 is provided on the side of the light-emitting layer group 33 away from the base substrate 1, the second electrode 34 may be a cathode (common electrode), and the second electrode 34 is connected to the ground line VSS. The light-emitting layer group 33 in an opening part emits light to form a sub-pixel, therefore, the light-emitting layer group 33 in an opening part is a sub-pixel, so that the orthographic projection of the sub-pixel on the display substrate is the orthographic projection of the light-emitting layer group 33 on the display substrate. The display substrate may include a plurality of sub-pixels.

The light-emitting layer group 33 may include a hole injection layer, a hole transport layer, a light-emitting layer, an electron transport layer, and an electron injection layer stacked in sequence. The hole injection layer is in contact with the first electrode 31, and the electron injection layer is in contact with the second electrode 34. In other example embodiments of the present disclosure, the light-emitting layer group 33 may only include a hole transport layer, a light-emitting layer, and an electron transport layer, and the light-emitting layer group 33 may also have other structures, and its specific structure may be provided as required.

An encapsulation layer group 4 is disposed on a side of the second electrode 34 away from the base substrate 1. The encapsulation layer group 4 can be provided as a plurality of layers, and the encapsulation layer group 4 can include organic layers and inorganic layers. Specifically, the encapsulation layer group 4 can include a first inorganic layer, an organic layer provided on the side of the first inorganic layer away from the base substrate 1, and a second inorganic layer provided on the side of the organic layer away from the base substrate 1. The materials of the first inorganic layer, the organic layer and the second inorganic layer will not be repeated here. The encapsulation layer group 4 may also include more layers or fewer layers.

In this example embodiment, referring to FIG. 3 and FIG. 16, a touch layer group 5 is provided on the side of the encapsulation layer group 4 away from the base substrate 1, and the touch layer group 5 may include a barrier layer 51, a second touch layer 52, a touch insulation layer 53, a second touch layer 54, and a protection layer 55. The barrier layer 51 is provided on the side of the encapsulation layer group 4 away from the base substrate 1. The material of the barrier layer 51 is generally SiNx material. The first touch layer 52 is provided on the side of the barrier layer 51 away from the base substrate 1, and the first touch layer 52 may be a three-layer structure of Ti/Al/Ti, a three-layer structure of ITO/Ag/ITO, or the like. The touch insulation layer 53 is provided on the side of the first touch layer 52 away from the base substrate 1, and the material of the touch insulation layer 53 is generally SiNx material. The second touch layer 54 is provided on the side of the touch insulation layer 53 away from the base substrate 1, and the second touch layer 54 may be a three-layer structure of Ti/Al/Ti, ITO/Ag/ITO, or the like. The protection layer 55 is provided on the side of the second touch layer 54 away from the base substrate 1, and the material of the protection layer 55 is PI (polyimide). The materials and structures of the above-mentioned film layers are just examples, and can also be selected and provided according to needs.

Referring to FIG. 3 and FIG. 16, the first touch layer 52 and the second touch layer 54 are provided as a conductive grid structure, that is, the first touch layer 52 and the second touch layer 54 are a plurality of grids formed by interweaving a plurality of metal wires, and the grid is a polygon composed of a plurality of gridlines. One grid corresponds to one sub-pixel, and the orthographic projection of the sub-pixel on the base substrate 1 is located within the orthographic projection of the grid on the base substrate 1, so as to prevent the grid lines from blocking the light emitted by the sub-pixel and ensure the display effect of the display panel. Moreover, the orthographic projection of the first electrode 31 on the base substrate 1 is located within the orthographic projection of the grid on the base substrate 1.

Referring to FIG. 4 and FIG. 5, the conductive grid structure forms the touch detection electrode 61. The touch detection electrode 61 may be of a mutually capacitive structure. The touch detection electrode 61 may include a plurality of first touch units 611 and a plurality of second touch units 612. The first touch unit 611 and the second touch unit 612 also include a plurality of grids, and the grid is a polygon formed by a plurality of grid lines. The first touch unit 611 and the second touch unit 612 in the form of metal mesh have the advantages of low resistance, small thickness and fast response speed, etc.

Referring to FIG. 4 and FIG. 5, the second touch unit 612 has a line shape extending along the first direction X, and a plurality of second touch units 612 are arranged in sequence along the second direction Y The first touch unit 611 has a line shape extending along the second direction Y, and a plurality of first touch units 611 are arranged in sequence along the first direction X, and the first direction X intersects with the second direction Y Each first touch unit 611 may include a plurality of first touch electrodes 6111 and first connection parts 6112 arranged in sequence along the second direction Y, the plurality of first touch electrodes 6111 are provided at intervals, and adjacent first touch electrodes 6111 are connected to each other through the first connection part 6112. Each second touch unit 612 may include a plurality of second touch electrodes 6121 and second connection parts 6122 arranged in sequence along the first direction X, the plurality of second touch electrodes 6121 are provided at intervals, and adjacent second touch electrodes 6121 are connected to each other through the second connection part 6122.

Figure 6:
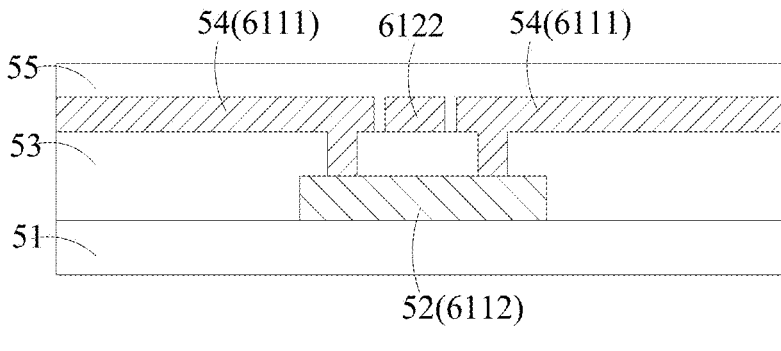
FIG. 6 is a schematic sectional diagram taken according to II in FIG. 4.
Figure 7:
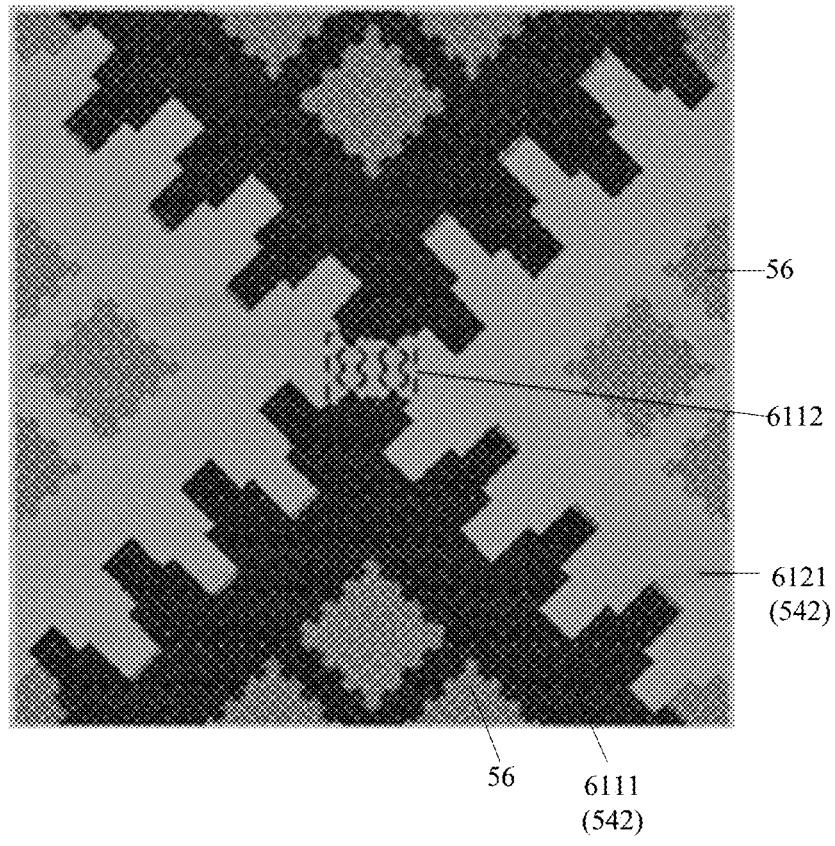
FIG. 7 is a schematic structural diagram of the touch pattern in FIG. 4.
Figure 8:
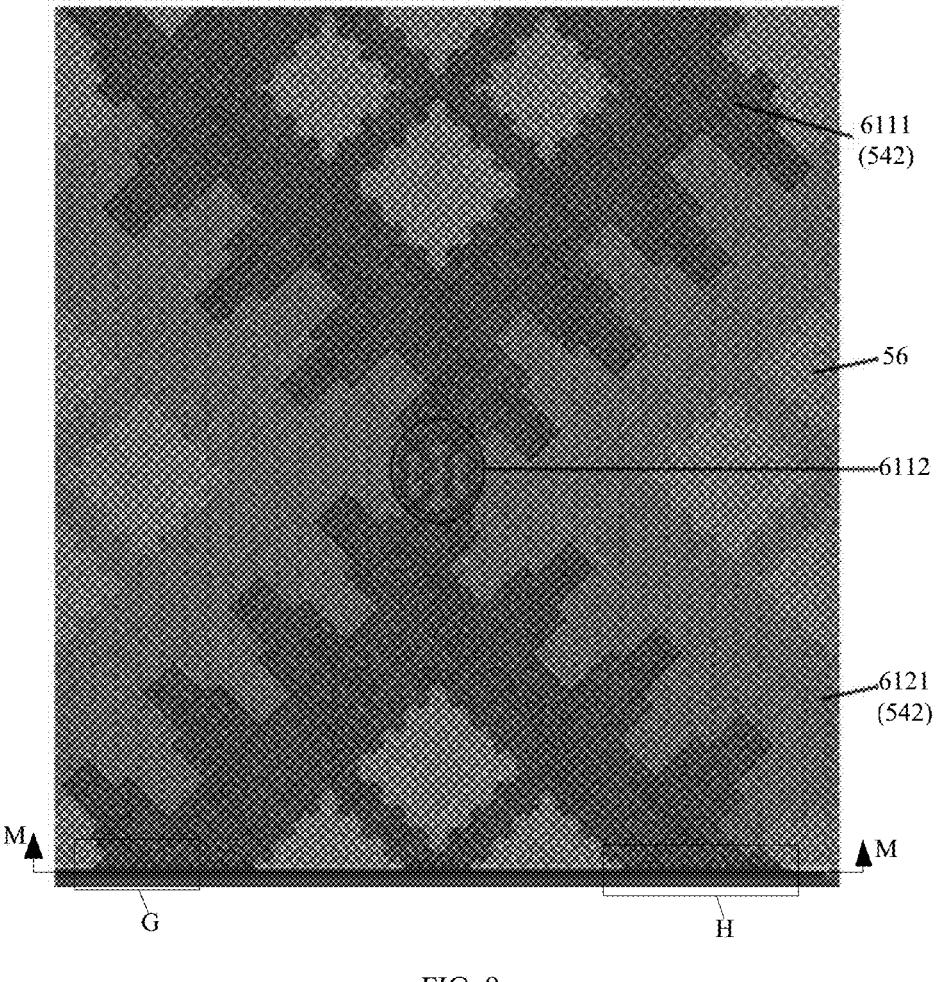
FIG. 8 is a structural schematic diagram of the connection between the touch pattern in FIG. 7 and the peripheral touch detection lead 62.

In some example embodiments, as shown in FIG. 6, the first touch electrode 6111, the second touch electrode 6121 and the second connection part 6122 are provided in the same layer, and can be formed by one patterning process, and the second touch electrode 6121 and the second connection part 6122 are an integral structure. The first connection part 6112 can be provided in a bridging layer to form a bridging structure, and the touch insulation layer 53 is provided between the first connection part 6112 and the second connection part 6122.

For example, the second touch layer 54 may include a first touch electrode 6111, a second touch electrode 6121 (not shown in the drawing) and a second connection part 6122, and the second touch electrode 6121 and the second connection part 6122 are connected as a whole within the second touch layer 54; moreover, a gap is provided between the first touch electrode 6111 and the second touch electrode 6121 and the second connection part 6122, and the gap is realized by the disconnected line of the metal grid. The first touch layer 52 may include a first connection part 6112, and the first connection part 6112 is connected to two adjacent first touch electrodes 6111 through a via hole provided in the touch insulation layer 53, so as to achieve the purpose of connecting a plurality of first touch electrodes 6111 sequentially arranged in second direction Y into a whole.

Since the driving backplane 2 needs to be connected with electrical signals, the first touch electrode 6111, the second touch electrode 6121 and the second connection part 6122 also need to be connected with electrical signals, the first touch electrode 6111, the second touch electrode 6121 and the second connection part 6122 are farther away from the driving backplane 2 than the first touch layer 52, reducing the interference of the electrical signals between the driving backplane 2 and the first touch electrode 6111, the second touch electrode 6121 and the second Connection part 6122, and ensuring the display effect and touch effect of the display panel. In some other example embodiments of the present disclosure, the first touch layer 52 may also include the first touch electrode 6111, the second touch electrode 6121 and the second connection part 6122, and the second touch layer 54 may also include the first connection part 6112.

In some other example embodiments, the first touch electrode 6111, the first connection part 6112 and the second touch electrode 6121 are provided in the same layer, and can be formed by one patterning process. The first touch electrode 6111 and the first connection part 6112 is an integral structure, the second connection part 6122 can be provided in a bridging layer to form a bridging structure, and an insulation layer is provided between the first connection part 6112 and the second connection part 6122.

For example, the second touch layer 54 may include a first touch electrode 6111, a second touch electrode 6121 and a first connection part 6112, and the first touch electrode 6111 and the first connection part 6112 are connected into a whole within the second touch layer 54; moreover, a gap is provided between the second touch electrode 6121 and the first touch electrode 6111 and the first connection part 6112, and the gap is realized by the disconnected line of the metal grid. The first touch layer 52 may include a second connection part 6122, and the second connection part 6122 is connected to two adjacent second touch electrodes 6121 through the fourth via hole 5314 provided in the touch insulation layer 53, so as to achieve the purpose of connecting a plurality of second touch electrodes 6121 sequentially arranged along the first direction X into a whole. In some other example embodiments of the present disclosure, the first touch layer 52 may also include a first touch electrode 6111, a second touch electrode 6121 and a first connection part 6112, and the second touch layer 54 may also include a second connection part 6122.

In some example embodiments, the first touch electrode 6111 may be a driving electrode, and the second touch electrode 6121 may be a sensing electrode. Alternatively, the first touch electrode 6111 may be a sensing electrode, and the second touch electrode 6121 may be a driving electrode. A plurality of first touch units 611 and a plurality of second touch units 612 form M rows of driving electrodes*N columns of sensing electrodes, that is, include M first touch units 611 and N second touch units 612, M and N is positive integers greater than two.

In some example embodiments, the first touch electrode 6111 and the second touch electrode 6121 may have a rhombus shape, for example, may be a regular rhombus, or a horizontally long rhombus, or a vertically long rhombus. In some possible embodiments, the first touch electrode 6111 and the second touch electrode 6121 may have shapes of any one or more of triangle, square, trapezoid, parallelogram, pentagon, hexagon and other polygons, the present disclosure is not limited here.

Referring to FIG. 4, in the peripheral region ZB, peripheral touch detection leads 62 are provided, and the peripheral touch detection lead 62 may include a first touch detection lead 621 and a second touch detection lead 622 (for clarity, different leads in the figure adopt different line types for distinguishing).

A first end of a part of the first touch detection leads 621 is correspondingly connected to an end of the first touch unit 611, and a second end of the first touch detection lead 621 is led out to the bonding pin 75 and connected to the bonding pin 75. A first end of other part of the first touch detection leads 621 is correspondingly connected to an opposite end of the first touch unit 611, and a second end of the other part of the first touch detection leads 621 is led out to the bonding pin 75 and connected to the bonding pin 75.

Referring to FIG. 4, a first end of the second touch detection lead 622 is correspondingly connected to an end of the second touch unit 612, and a second end of the second touch detection lead 622 is led out to the bonding pin 75 and is connected to bonding pin 75. This lining mode can also be called as 2T1R (where the first touch unit 611 is a touch driving unit, and the second touch unit 612 is a touch sensing unit). It can also be 1T2R (where the first touch unit 611 is a touch sensing unit, and the second touch unit 612 is a touch driving unit).

It can be understood that the first touch electrodes 6111 located in the same row are arranged in sequence along the second direction Y (the long side of the display region AA), and the number of the first touch electrodes 6111 included in a row of first touch units 611 is relatively larger, and the touch signal transmits sequentially along a row of first touch electrodes 6111, along the direction away from the first touch detection lead 621, starting from the first touch detection electrode 6111 being coupled with the first one of the first touch detection leads 621. However, as the transmission distance increases, the touch signal will gradually attenuate. Based on this, in the case that the number of first touch electrodes 6111 is large, the two ends of the same row of first touch electrodes 6111 are respectively coupled to the first touch detection leads 621, which can ensure that the first touch electrode 6111 in the row of first touch electrodes 6111 farthest from the first touch detection lead 621 receives the touch signal.

The lining mode shown in FIG. 5 may also be referred to as 1T1R.

In some other example embodiments of the present disclosure, the second touch detection lead 622 can be provided as two parts, a first end of a part of the second touch detection leads 622 is correspondingly connected to an end of the second touch unit 612, and a second end of the second touch detection lead 622 is led out to the bonding pin 75 and connected to the bonding pin 75. A first end of the other part of the second touch detection leads 622 is correspondingly connected to an opposite end of the second touch unit 612, and a second end of the other part of the second touch detection leads 622 is led out to the bonding pin 75 and connected to the bonding pin 75.

This lining mode can also be called as 2T2R. This lining method can ensure that among the row of touch electrodes 542 coupled with the touch detection leads 62, the touch signal received by the touch electrode 542 more far from the touch lead and the touch signal received by the touch electrode 542 closer to the touch lead are not much different, which ensures the touch accuracy of the touch screen with relatively larger size.

In some example embodiments, as shown in FIG. 4, a first end of a part of the first touch detection leads 621 is connected to an end of the first touch unit 611 adjacent to the bonding region BOD, the first touch detection leads 621 only pass through the second peripheral region ZB2, and the second end can be made to be directly led out to the bonding pin 75. A first end of the other part of the first touch detection leads 621 is connected to an end of the first touch unit 611 away from the bonding region BOD, and this part of the first touch detection leads 621 needs to pass through the first peripheral region ZB1, the fourth peripheral region ZB4 and the second peripheral region ZB2, so that the second end can be led out to the bonding pin 75.

A first end of a part of the second touch detection leads 622 is correspondingly connected to an end of the second touch unit 612. The second touch detection lead 622 needs to pass through the third peripheral region ZB3 and the second peripheral region ZB2, so that the second end can be led out to the bonding pin 75.

In the case that an end of the second touch unit 612 is connected with a second touch detection lead 622, a first end of another part of the second touch detection leads 622 is correspondingly connected to another opposite end of the second touch unit 612. This part of second touch detection leads 622 needs to pass through the fourth peripheral region ZB4 and the second peripheral region ZB2, so that the second end can be led out to the bonding pin 75.

Touch principle is that: the second touch electrode 6121 and the first touch electrode 6111 can form a capacitor, and a plurality of first touch electrodes 6111 and a plurality of second touch electrodes 6121 can form a plurality of capacitors (such as C1, C2, C3 . . . ). Each capacitor has a different position in the touch detection electrode 61. It can also be said that in the coordinate system formed by the first direction X and the second direction Y, each capacitor is located at a different point. The touch driving chip 12 transmits a touch driving signal (such as a trigger signal) to the first touch detection lead 621, and the touch driving signal is transmitted to the first touch electrode 6111 through the first touch detection lead 621. At this time, each capacitor at the above-mentioned different positions has an initial capacitance value. Since the human body itself is a conductor, when a human finger touches a certain position of the display panel, the capacitance value of the capacitor at that position will change. According to the variation of the capacitance value, the second touch electrode 6121 at that position will receive a corresponding touch sensing signal (for example, a receiving signal). The touch sensing signal on the second touch electrode 6121 at that position is transmitted to the touch driving chip 12 through the second touch detection lead 622. The capacitance value of the capacitor at the untouched position does not change. Therefore, by judging the capacitance value of each capacitor, the touch point can be determined, thereby realizing the touch function.

The first touch electrodes 6111 and the second touch electrodes 6121 within the dotted rectangle in FIG. 4 form a complete touch pattern 56. Referring to the schematic structural diagram of the touch pattern 56 shown in FIG. 7, the first touch electrode 6111 is provided with a dummy part 561, and the dummy part 561 is provided at intervals with first touch electrode 6111; the second touch electrode 6121 is also provided with a dummy part 561, the dummy part 561 is also provided at intervals with the second touch electrode 6121; the dummy part 561 is only for the convenience of unified setting and process manufacturing; the dummy part 561 does not access touch signals, therefore, the dummy part 561 does not need to be connected with the first touch line 521 and the second touch line 541. The interval between the dummy part 561 and the first touch electrode 6111 and the second touch electrode 6121 is realized by the disconnected line of the grid.

Referring to FIG. 4 and FIG. 5, since all peripheral touch detection leads 62 need to be connected to the bonding pin 75, therefore, the closer to the bonding region BOD the more the number of the peripheral touch detection leads 62, which results in that the third peripheral region ZB3, the fourth peripheral region ZB4, and the second peripheral region ZB2 close to the bonding region BOD need to accommodate more peripheral touch detection leads 62. Under the requirements of narrow frames, in order to accommodate all peripheral touch detection leads 62 in the peripheral region ZB, not only the width of the peripheral touch detection lead 62 should be designed narrower, the width of the peripheral touch detection lead 62 is greater than or equal to 3 microns and less than or equal to 50 microns, for example, its width can be 5 microns, 8 microns, 12 microns, 16 microns, 20 microns, 25 microns, 30 microns, 24.5 microns, 29 microns, 35.7 microns, 41 microns, 48 microns, etc. But also, the distance between the two adjacent peripheral touch detection leads 62 is smaller, and the distance between the two adjacent peripheral touch detection leads 62 is greater than or equal to 3 micron and less than or equal to 20 microns;

for example, its width can be 5 microns, 8 microns, 9.5 microns, 10 microns, 12.7 microns, 14.5 microns, 18 microns, 20 microns, etc.

Such setting makes the resistance of the peripheral touch detection lead 62 relatively larger. To ensure the touch effect of the display panel, it is needed to increase the power supply voltage of the display panel, resulting in an increase in energy consumption of the display panel, which is not conducive to the thinner and lighter design. Therefore, referring to FIG. 8 and FIG. 9, the peripheral touch detection leads 62 are provided as a double-layer structure, that is, the peripheral touch detection lead 62 may include a first touch line 521 and a second touch line 541, the first touch line 521 may be provided in the first touch layer 52, and the second touch line 541 can be provided in the second touch layer 54. The first touch line 521 and the second touch line 541 are conductively connected through the via hole 531 provided in the touch insulation layer 53 to reduce the resistance of the peripheral touch detection lead 62. That is to say, the first touch detection lead 621 may include the first touch line 521 and the second touch line 541. The second touch detection lead 622 may include the first touch line 521 and the second touch line 541, so that the first touch line 521 and the second touch line 541 form a signal transmission path, and transmit the same touch signal.

The orthographic projection of the first touch line 521 on the base substrate 1 at least partially overlaps with the orthographic projection of the second touch line 541 on the base substrate 1, for example, the orthographic projection of the first touch line 521 on the substrate on the substrate 1 may be located within the orthographic projection of the second touch line 541 on the base substrate 1. The width of the first touch line 521 may be equal to the width of the peripheral touch detection lead 62, and the width of the second touch line 541 may be equal to the width of the peripheral touch detection lead 62. The distance between two adjacent first touch lines 521 is equal to the distance between two adjacent peripheral touch detection leads 62. The distance between two adjacent second touch lines 541 is equal to the distance between two adjacent peripheral touch detection leads 62. Since the second touch line 541 needs to be connected to the functional structure 7 of the display panel, the length of the second touch line 541 can be greater than the length of the first touch line 521, so that the orthographic projection of the first touch line 521 on the base substrate 1 can be located within the orthographic projection of the second touch line 541 on the base substrate 1. Due to errors of process and equipment, there may be a certain misplacement in the width direction between the first touch line 521 and the second touch line 541.

In the case that the first touch line 521 needs to be connected to the functional structure 7 of the display panel, the length of the first touch line 521 may be greater than the length of the second touch line 541. In the case that both the first touch line 521 and the second touch line 541 need to be connected to the functional structure 7 of the display panel, the length of the first touch line 521 can be substantially equal to the length of the second touch line 541.

However, since the width of the first touch line 521 and the width of the second touch line 541 are designed to be relatively narrow, it is not possible to provide a via hole 531 on the touch insulation layer 53 at the preset length of the first touch line 521 and the second touch line 541 as required to connect the first touch line 521 and the second touch line 541.

Furthermore, the thickness of the first touch layer 52 is inconsistent with the thickness of the second touch layer 54 due to errors of process, equipment, etc., so that the thickness of the first touch line 521 and the thickness of the second touch line 541 are also inconsistent, which results in that the resistance per unit length of the second touch line 541 is different from the resistance per unit length of the first touch line 521, and the resistance per unit length refers to the resistance per unit length of the conductor at a reference temperature. After the same touch driving signals are transmitted through the first touch line 521 and the second touch line 541 respectively, the attenuation degree of the touch driving signal on the first touch line 521 is inconsistent with that on the second touch line 541, which will lead to inconsistencies of the touch driving signals input to the touch electrodes 542 in the display region AA; similarly, after a touch action occurs and a touch sensing signal is generated, the same touch sensing signals are transmitted through the first touch line 521 and the second touch line 541 respectively, the attenuation degree of the touch sensing signal on the first touch line 521 is inconsistent with that on the second touch line 541, which will lead to inconsistency of touch sensing signals input to the touch driving chip, thereby affecting the touch effect.

Figures 10, 11:
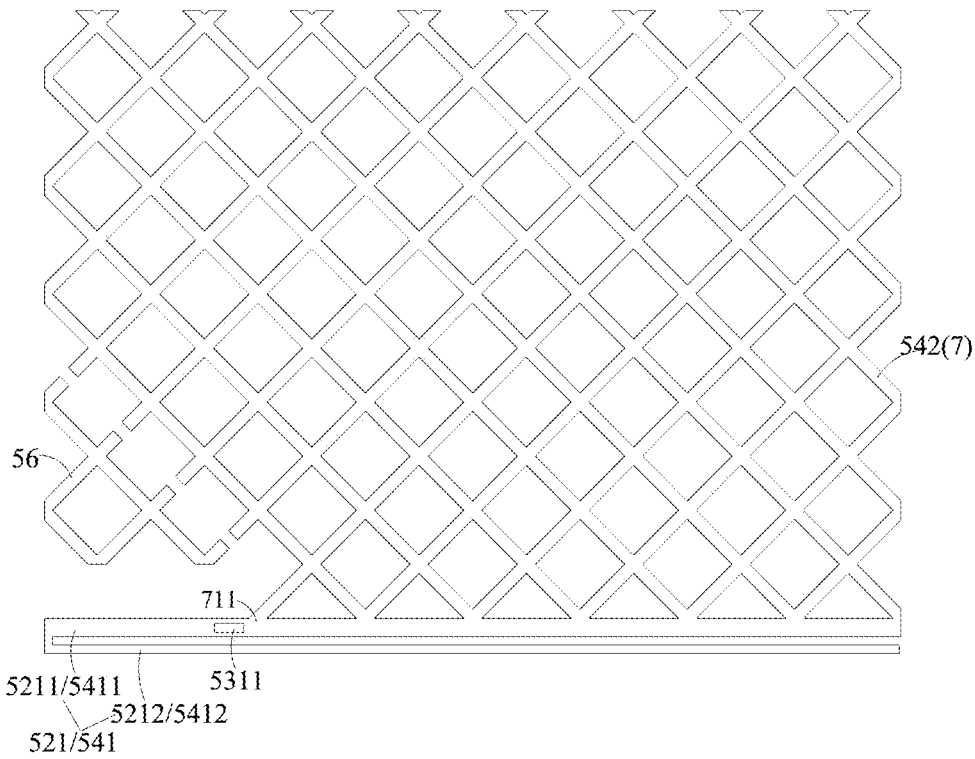
FIG. 10 is a partially enlarged schematic diagram of the part indicated by G in FIG. 8.
FIG. 11 is a partially enlarged schematic diagram of the part indicated by H in FIG. 8.

In this example embodiment, as shown in FIG. 10 to FIG. 11, in the peripheral region ZB, the first touch line 521 may include a first part 5211 and a second part 5212; the second part 5212 is connected to the first part 5211, and the width of the second part 5212 is smaller than the width of the first part 5211. The second touch line 541 may include a third part 5411 and a fourth part 5412; the third part 5411 is provided opposite to the first part 5211; the third part 5411 is connected to the touch electrode 542. The fourth part 5412 is connected to the third part 5411, the fourth part 5412 is provided opposite to the second part 5212, and the width of the fourth part 5412 is smaller than the width of the third part 5411. The first part 5211 is connected to the third part 5411 through the first via hole 5311, the second via hole 5312 and the third via hole 5313.

The width of the first part 5211 connected to the touch electrode 542 is set to be wider, and the width of the third part 5411 connected to the first part 5211 is set to be wider, so that the first via hole 5311, the second via hole 5312 and the third via hole 5313 can be provided in the touch insulation layer 53 between the first part 5211 and the third part 5411 to ensure the connection between the first part 5211 and the third part 5411; and the width of the second part 5212 and the width of the fourth part 5412 is set to be narrower, which can satisfy the requirement of a narrow frame of the display panel.

In addition, referring to FIG. 4 and FIG. 5, the third part 5411 is connected to the edge of the touch electrode 542 close to the peripheral region ZB, and the edges of the plurality of touch electrodes 542 close to the peripheral region ZB are on a line, therefore, a plurality of third parts 5411 connected to a plurality of touch electrodes 542 are on a line. Accordingly, in essence, only a circle of peripheral touch detection leads 62 (the first touch line 521 or the second touch line 541) closest to one side, two sides or three sides of the display region AA is set to be wider, and other peripheral touch detection leads 62 can be set to be narrower, which can satisfy the requirement of a narrow frame of the display panel.

In the case that the touch electrode 542 is provided in the first touch layer 52, the first part 5211 is connected to the touch electrode 542. It is also possible that both the first part 5211 and the third part 5411 are connected to the touch electrode 542.

A part of the first touch line 521 and/or the second touch line 541 connected to the functional structure 7 of the display panel forms a connection part 71, and at least one via hole 531 is at least located on a side of the connection part 71 away from the functional structure 7.

Figure 9:
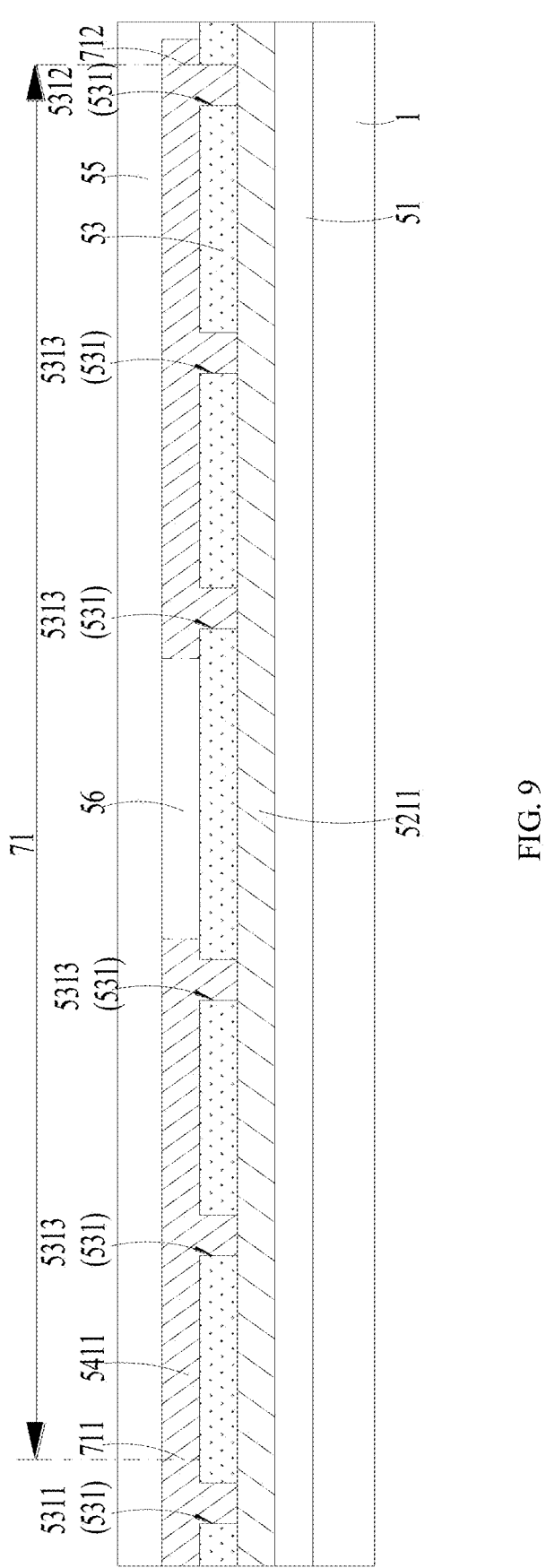
FIG. 9 is a schematic sectional diagram taken according to M-M in FIG. 8.

Referring to FIG. 8 to FIG. 11, since the second touch line 541 is not connected to the dummy part 56 in FIG. 9, no section line is added to the dummy part 56 for distinguishing the dummy part 56. The specific structure of the middle part is basically the same, so the connection relationship between the start point 711 and the end point 712 is mainly reflected. Specifically, the functional structure 7 may include a touch electrode 542, and the touch electrode 542 is located in the display region AA. The touch electrode 542 can be provided in the second touch layer 54, therefore, the touch electrode 542 is connected to the second touch line 541, and the edges of the touch electrode 542 close to the non-display region NA are all connected to the second touch line 541, so that the connection between the touch electrode 542 and the second touch line 541 is a segment rather than a point, therefore, the connection part 71 between the touch electrode 542 and the second touch line 541 has a start point 711 and an end point 712. In this way, at the edges of the touch electrode 542 close to the non-display region NA, the touch driving signal is input or the touch sensing signal is output, which increases the width of the channel for transmitting the signal, thereby reducing the resistance. Moreover, it makes that the touch driving signal is uniformly input to the touch electrode 542, or the touch sensing signal generated by the touch electrode 542 can be output.

In some other example embodiments of the present disclosure, in the case that the touch electrode 542 is provided in the first touch layer 52, the touch electrode 542 is connected to the first touch line 521. Similarly, the connection part 71 between the first touch line 542 and the first touch line 521 also has a start point 711 and an end point 712.

The via hole 531 may include a first via hole 5311, and the first via hole 5311 is located on the side of the connection part 71 away from the touch electrode 542. Specifically, the first via hole 5311 is located on the side of the start point 711 away from the end point 712. That is, the first via hole 5311 is located before the second touch line 541 is connected to the touch electrode 542. In the case that the touch electrode 542 is a touch driving electrode, the touch driving signal on the first touch line 521 and the touch driving signal on the second touch line 541 are converged at the first via hole 5311, so that the touch driving signals input to the touch electrode 542 are consistent. In the case that the touch electrode 542 is a touch sensing electrode, the touch sensing signal output from the touch electrode 542 is transmitted to the first touch line 521 and the second touch line 541 at the same time, ensuring that the initial data of the touch sensing signal transmitted on the first touch line 521 is consistent with the initial data of the touch sensing signal of the second touch line 541.

Further, the via hole 531 may further include a second via hole 5312, and the second via hole 5312 is located on a side of the end point 712 close to the start point 711. The touch detection leads 62 connected to the edge of the touch electrode 542 close to the non-display region NA are all of a double layer structure, which increases the thickness of the channel for transmitting signals, thereby reducing the resistance. The touch driving signal can be evenly input to the touch electrode 542, or the touch sensing signal generated by the touch electrode 542 can be output.

Moreover, the orthographic projection of the second via hole 5312 on the base substrate 1 at least partially overlaps with the orthographic projection of the end point 712 on the base substrate 1, that is, at the end point 712 where the touch electrode 542 is connected to the second touch line 541, the second touch line 541 is connected to the first touch line 521 through the second via hole 5312. Since providing the via hole for connecting the first touch line 521 and the second touch line 541 beyond the end point 712 where the touch electrode 542 is connected to the second touch line 541, cannot play the role of converging the signals and then transmitting them to the touch electrode 542, the end point 712 is the last point where the signals are input into the touch electrodes 542. Therefore, a second via hole 5312 is provided at the end point 712.

Further, referring to FIG. 9 and FIG. 11, the via hole 531 may further include a third via hole 5313, the third via hole 5313 is located between the first via hole 5311 and the second via hole 5312, and the third via hole 5313 may be provided as one, two or more. Through the third via hole 5313, the first touch line 521 and the second touch line 541 are connected at more than one place, so that the touch driving signal on the first touch line 521 and the touch driving signal on the second touch line 541 are converged at more than one place, further ensuring the consistency of the touch driving signals input to the touch electrode 542.

It should be noted that the start point 711 is closer to the touch driving chip 12 than the end point 712.

Figure 12:
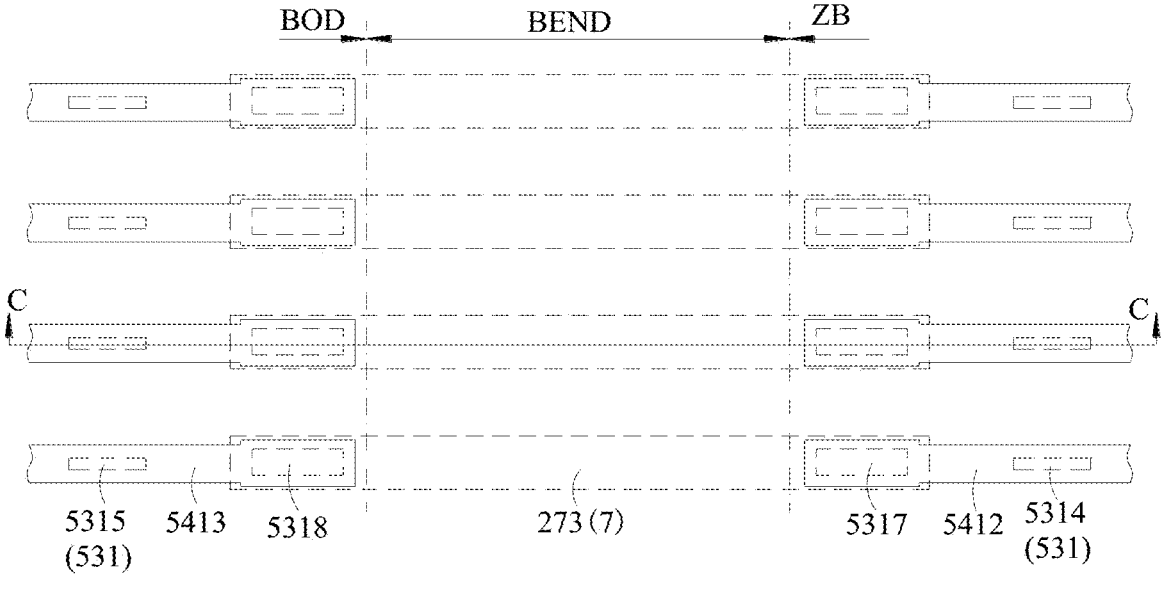
FIG. 12 is a structural schematic diagram of the bending region of the display panel and two sides of the bending region in the present disclosure.
Figure 13:
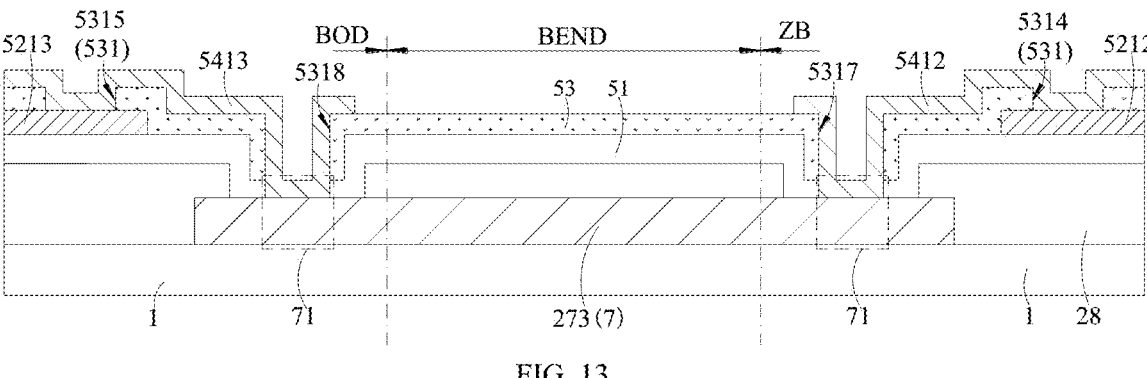
FIG. 13 is a schematic sectional diagram taken according to C-C in FIG. 12.

In this example embodiment, referring to FIG. 12 and FIG. 13, the dotted line in FIG. 12 indicates the part blocked by the upper layer, the first source-drain layer 27 may also include a connection wire 273. The connection wire 273 is provided in the bending region BEND, and extends to the peripheral region ZB and the bonding region BOD. The connection wire 273 can be provided with the first source-drain layer 27 in the same layer and the same material. That is, the connection wire 273 can be formed with the source 271 and the drain 272 through the same patterning process. In the case that the second source-drain layer 30 is provided, the connection wire 273 can be provided with the second source-drain layer 30 in the same layer and the same material, that is, the connection wire 273 can be formed with the second source-drain layer 30 through the same patterning process.

A part of the first touch line 521 and/or the second touch line 541 connected to the connection wire 273 forms a connection part 71, and the connection wire 273 may be a functional structure 7.

The touch insulation layer 53 is also provided with a first adapter hole 5317, the first adapter hole 5317 is located in the peripheral region ZB, and is located close to the bending region BEND, that is, the first adapter hole 5317 is located within a part region of the peripheral region ZB near the bending region BEND. The second touch line 541 is connected to the connection wire 273 through the first adapter hole 5317, specifically, the fourth part 5412 is connected to the connection wire 273 through the first adapter hole 5317. In this way, the touch signal is transmitted through the connection wire 273 in the bending region BEND without providing the first touch line 521 and the second touch line 541; and the first source-drain layer 27 where the connection wire 273 is located, is located in the neutral layer. During the bending process of the material, the outer layer is stretched and the inner layer is squeezed, there must be a transition layer on its cross section that is neither stretched nor squeezed and where the stress is almost equal to zero. This transition layer is called the neutral layer of the material. The length of the neutral layer during the bending process remains the same as before bending. Therefore, when the display panel is bent, the connection wire 273 is neither stretched nor squeezed, and the connection wire 273 is not easy to break, which ensures the touch performance of the display panel.

The via hole 531 may also include a fourth via hole 5314. The fourth via hole 5314 is located in the peripheral region ZB and is located close to the bending region BEND, that is, the fourth via hole 5314 is located in a part region of the peripheral region ZB close to the bending region BEND. The second touch line 541 is connected to the first touch line 521 through the fourth via 5314, specifically, the second part 5212 is connected to the fourth part 5412 through the fourth via 5314.

The connection part 71 is formed at the first adapter hole 5317. The first adapter hole 5317 is located on a side of the fourth via hole 5314 close to the bending region. The fourth via hole 5314 is located on the side of the connection part 71 away from the functional structure 7 (the connection wire 273). The second touch line 541 is connected with the first touch line 521 through the fourth via hole 5314, and the touch sensing signal on the first touch line 521 is merged with the touch sensing signal on the second touch line 541 at the fourth via hole, so that the touch sensing signals input to the connection wire 273 are consistent. Moreover, the touch driving signal output from the connection wire 273 is simultaneously transmitted to the first touch line 521 and the second touch line 541, ensuring that the initial data of the touch driving signal transmitted on the first touch line 521 is consistent with the initial data of the touch driving signal transmitted on the second touch line 541.

The width of the section of the fourth part 5412 opposite to the connection wire 273 may be greater than the width of the remaining sections. The width of the first adapter hole 5317 can be set to be greater than the width of the fourth via hole 5314.

It should be noted that, in the case that other insulation layers are provided between the fourth part 5412 and the connection wire 273, through holes need to be provided in these insulation layers, so that the fourth part 5412 are connected and conducted with the connection wire 273.

In this example embodiment, the first touch line 521 may further include a fifth part 5213, and the fifth part 5213 is provided in the bonding region BOD. The second touch line 541 may further include a sixth part 5413, and the sixth part 5413 is also located in the bonding region BOD. The orthographic projection of the sixth part 5413 on the base substrate 1 at least partially overlaps with the orthographic projection of the fifth part 5213 on the base substrate 1. For example, the width of the sixth part 5413 may be equal to the width of the fifth part 5213. Since the sixth part 5413 needs to be connected to the functional structure 7 of the display panel, the length of the sixth part 5413 may be greater than the length of the fifth part 5213, so that the orthographic projection of the sixth part 5413 on the base substrate 1 can cover the orthographic projection of the fifth part 5213 on the base substrate 1. The sixth part 5413 and the fifth part 5213 may have a certain misplacement in the width direction due to errors of the process and the equipment.

The touch insulation layer 53 is also provided with a second adapter hole 5318. The second adapter hole 5318 is located in the bonding region BOD and is provided close to the bending region BEND. That is, the second adapter hole 5318 is located within a part region of the bonding region BOD near the bending region BEND, and the sixth part 5413 is connected to the connection wire 273 through the second adapter hole 5318. Therefore, the touch signal is transmitted through the first touch line 521 and the second touch line 541 in the bonding region BOD, rather than that the touch signal is transmitted through the connection wire 273.

The via hole 531 may also include a fifth via hole 5315. The fifth via hole 5315 is located in the bonding region BOD and is provided close to the bending region BEND. That is, the fifth via hole 5315 is located within a part region of the bonding region BOD close to the bending region BEND. The sixth part 5413 is connected to the fifth part 5213 through the fifth via hole 5315.

The connection part 71 is formed at the second adapter hole 5318. The second adapter hole 5318 is located on a side of the fifth via hole 5315 close to the bending region BEND. The fifth via hole 5315 is located on the side of the connection part 71 away from the functional structure 7 (the connection wire 273). The second touch line 541 (the sixth part 5413) is connected with the first touch line 521 (the fifth part 5213) through the fifth via hole 5315, and the touch driving signal on the first touch line 521 (the fifth part 5213) is merged with the touch driving signal on the second touch line 541 (the sixth part 5413) at the fifth via hole 5315, so that the touch driving signals input to the connection wire 273 are consistent. Moreover, the touch sensing signal output from the connection wire 273 is simultaneously transmitted to the first touch line 521 (the fifth part 5213) and the second touch line 541 (the sixth part 5413), ensuring that the initial data of the first touch sensing signal transmitted on the first touch line 521 (the fifth part 5213) is consistent with the initial data of the touch sensing signal transmitted on the second touch line 541 (the sixth part 5413).

The width of a section of the sixth part 5413 opposite to the connection wire 273 may be greater than the width of the remaining sections. The width of the second adapter hole 5318 can be set to be greater than the width of the fifth via hole 5315.

It should be noted that, in the case that other insulation layers are provided between the sixth part 5413 and the connection wire 273, through holes need to be provided in these insulation layers, so that the sixth part 5413 are connected and conducted with the connection wire 273.

Figure 14:
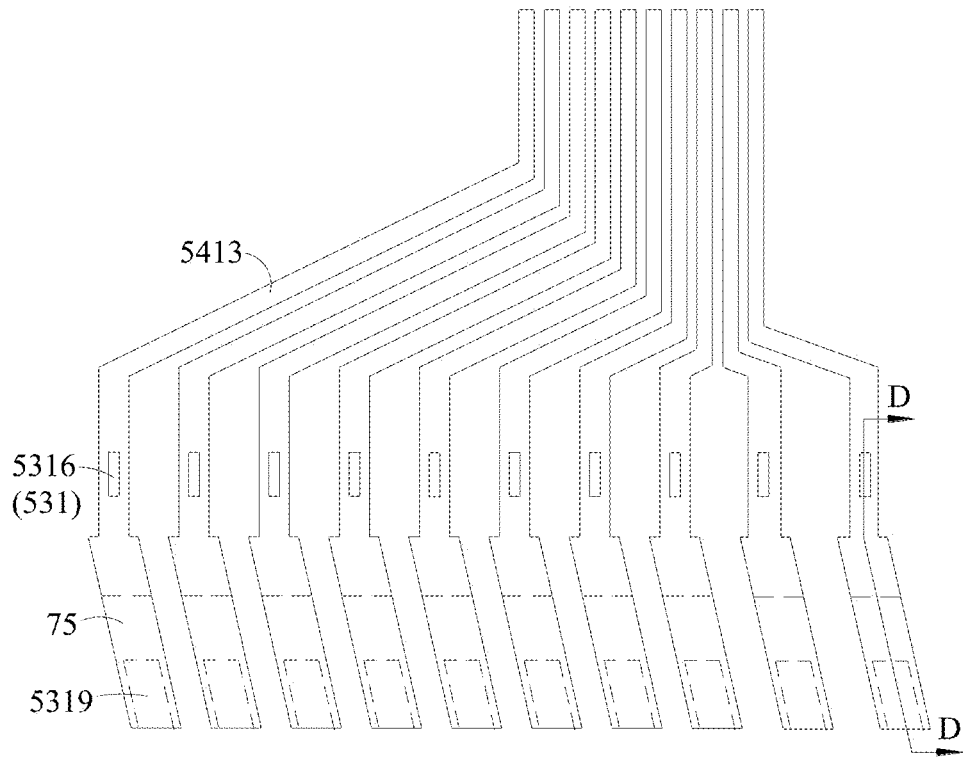
FIG. 14 is a schematic structural diagram of a bonding region of the display panel in the present disclosure.
Figure 15:
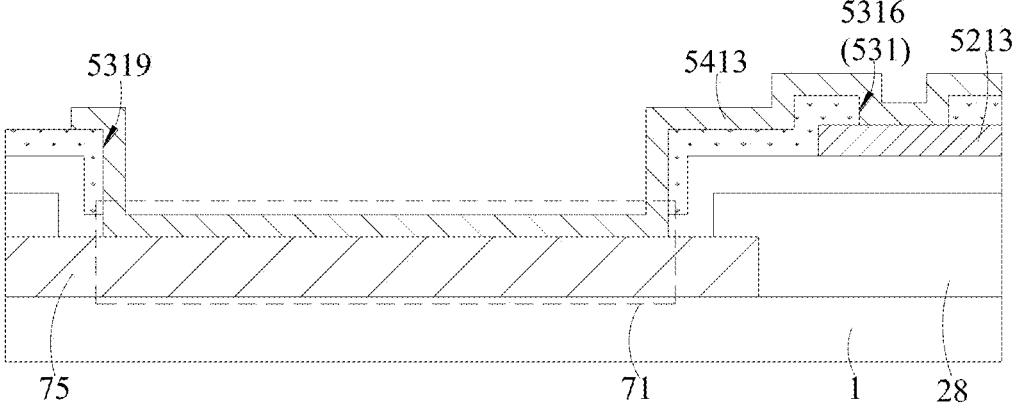
FIG. 15 is a schematic sectional diagram taken according to D-D of FIG. 12.

In this example embodiment, as shown in FIG. 14 to FIG. 15, the sixth part 5413 of the second touch line 541 is connected to the bonding pin 75. The bonding pin 75 is the functional structure 7, that is, the bonding pin 75 may be the functional structure 7 of the display panel connected to the first touch line 521 or the second touch line 541 to form the connection part 71.

The bonding pin 75 can be provided with the first source-drain layer 27 in the same layer and the same material. That is, the bonding pin 75 can be formed with the source 271 and the drain 272 through the same patterning process. In the case that the second source-drain layer 30 is provided, the bonding pin 75 can be provided with the second source-drain layer 30 in the same layer and the same material, that is, the bonding pin 75 can be formed with the second source-drain layer 30 through the same patterning process.

A third adapter hole 5319 is also provided in the touch insulation layer 53. The third adapter hole 5319 is located in the bonding region BOD, and is provided away from the bending region BEND. That is, the third adapter hole 5319 is located with a part region of the bonding region BOD away from the bending region BEND, and the sixth part 5413 is connected to the bonding pin 75 through the third adapter hole 5319. Moreover, the orthographic projection of the sixth part 5413 on the base substrate may cover the orthographic projection of the bonding pin 75 on the base substrate.

The via hole 531 may also include a sixth via hole 5316. The sixth via hole 5316 is located in the bonding region BOD and is provided close to the bonding pin 75. That is, the sixth via hole 5316 is located within a part region of the region the bonding region BOD close to the bonding pin 75. The sixth part 5413 is connected to the fifth part 5213 through the sixth via hole 5316.

The connection part 71 is formed at the place where the second touch line 541 is connected with the bonding pin 75, so that the sixth via hole 5316 is located on a side of the connection part 71 away from the functional structure 7 (the bonding pin 75). The second touch line 541 (the sixth part 5413) is connected with the first touch line 521 (the fifth part 5213) through the sixth via hole 5316, and the touch sensing signal on the first touch line 521 (the fifth part 5213) is merged with the touch sensing signal on the second touch line 541 (the sixth part 5413) at the eighth via hole, so that the touch sensing signals input to the bonding pin 75 are consistent. Moreover, the touch driving signal output from the bonding pin 75 is simultaneously transmitted to the first touch line 521 (the fifth part 5213) and the second touch line 541 (the sixth part 5413), ensuring that the initial data of the touch driving signal transmitted on the first touch line 521 (the fifth part 5213) is consistent with the initial data of the touch driving signal transmitted on the second touch line 541 (the sixth part 5413).

The width of the section of the sixth part 5413 opposite to the bonding pin 75 may be greater than the width of the remaining sections of the sixth part 5413. The width of the third adapter hole 5319 may be set to be greater than the width of the sixth via hole 5316.

In some other example embodiments of the present disclosure, the fifth part 5213 may also be connected with the bonding pin 75 and the connection wire 273, or both the fifth part 5213 and the sixth part 5413 may be connected with the bonding pin 75 and the connection wire 273.

In addition, the extension direction of the bonding pin 75 intersects with the extension direction of the sixth part 5413 to facilitate alignment.

Based on the same inventive concept, there is provides a display device according to example embodiments of the present disclosure, which may include the display panel described in any one of the above, and the specific structure of the display panel has been described in detail above, so it will not be repeated here.

The specific type of the display device is not particularly limited, and any type of display device commonly used in the art can be used, such as mobile devices such as mobile phones, wearable devices such as watches, VR devices, etc. Those skilled in the art can make corresponding selection according to the specific use of the display device, which will not be repeated here.

It should be noted that, in addition to the display panel, the display device also includes other necessary components and compositions, taking the display as an example, such as a casing, a circuit board, a power cord, etc. Those skilled in the art can make corresponding supplements according to the specific use requirements of the display device, which will not be repeated here.

Compared with the related art, the beneficial effect of the display device provided by the example embodiments of the present invention is the same as that of the display panel provided by the above example embodiments, and will not be repeated here.

Those skilled in the art will easily think of other embodiments of the present disclosure after considering the description and practicing the present disclosure. The present disclosure is intended to cover any modification, use or adaptation of the present disclosure, and these modifications, uses or adaptations follow the general principles of the present disclosure and include common knowledge or conventional technical means in the technical field not disclosed in the present disclosure. The description and examples are to be considered examples only, with the true scope and spirit of the present disclosure indicated by the appended claims.

What is claimed is:

1. A display panel, comprising a display region and a non-display region located on at least one side of the display region, wherein the display panel comprises:

a base substrate;

a first touch layer, provided on a side of the base substrate, wherein the first touch layer comprises a first touch line, and the first touch line is at least partially located in the non-display region;

a touch insulation layer, provided on a side of the first touch layer away from the base substrate, wherein the touch insulation layer is provided with at least one via hole, and the via hole is at least partially located in the non-display region;

a second touch layer, provided on a side of the touch insulation layer away from the base substrate, wherein the second touch layer comprises a second touch line, the second touch line is at least partially located in the non-display region, an orthographic projection of the second touch line on the base substrate at least partially overlaps with the an orthographic projection of the first touch line on the base substrate, and the second touch line is connected to the first touch line through the via hole;

wherein, a part of the first touch line and/or the second touch line connected to at least one functional structure of the display panel forms a connection part;

the at least one functional structure comprises a touch electrode, and the touch electrode is connected to the first touch line and/or the second touch line and located in the display region;

the first touch line comprises:

a first part; and a second part, provided on a side of the first part away from the touch electrode, wherein a width of the second part is smaller than a width of the first part;

the second touch line comprises:

a third part, wherein an orthographic projection of the third part on the base substrate at least partially overlaps with an orthographic projection of the first part on the base substrate; and a fourth part, provided on a side of the third part away from the touch electrode, wherein an orthographic projection of the fourth part on the base substrate at least partially overlaps an orthographic projection of the second part on the base substrate, and a width of the fourth part is smaller than a width of the third part;

and wherein, the first part and/or the third part are connected to the touch electrode, and the third part is connected to the first part through the at least one via hole.

2. The display panel according to claim 1, wherein the second part is connected to the first part, and the fourth part is connected to the third part.

3. The display panel according to claim 1, wherein a connection part between the touch electrode and the first touch line and/or the second touch line is provided with a start point and an end point; and the at least one via hole comprises:

a first via hole, located on a side of the start point away from the end point.

4. The display panel according to claim 3, wherein the at least one via hole further comprises:

a second via hole, wherein the second via hole is located on a side of the end point close to the start point.

5. The display panel according to claim 4, wherein an orthographic projection of the second via hole on the base substrate at least partially overlaps with an orthographic projection of the end point on the base substrate.

6. The display panel according to claim 4, wherein the at least one via hole further comprises:

at least one third via hole, located between the first via hole and the second via hole.

7. The display panel according to claim 6, wherein the third part is connected to the first part through the first via hole, the second via hole and the third via hole.

8. The display panel according to claim 7, wherein the first part and/or the third part are connected to an edge of the touch electrode close to the non-display region, and a plurality of first parts and/or a plurality of third parts are located on a same line.

9. The display panel according to claim 1, wherein the touch electrode comprises a touch driving electrode or a touch sensing electrode, and the touch electrode is provided in the second touch layer.

10. The display panel according to claim 1, wherein the non-display region comprises a peripheral region, a bending region and a bonding region, the peripheral region is closer to the display region, the bonding region is more far away from the display region, and the bending region is located between the peripheral region and the bonding region; the display panel further comprises:

a display substrate, provided between the base substrate and the first touch layer, wherein the display substrate comprises a source-drain layer, the source-drain layer comprises a connection wire, the connection wire is provided in the bending region and extends to the peripheral region and the bonding region, and the connection wire is the at least one functional structure.

11. The display panel according to claim 10, wherein the at least one via hole further comprises:

a fourth via hole, located in the peripheral region and provided close to the bending region, wherein the second touch line is connected to the first touch line through the fourth via hole.

12. The display panel according to claim 11, wherein the touch insulation layer is further provided with a first adapter hole, and the first adapter hole is located in the peripheral region and is provided close to the bending region, the second touch line is connected to the connection wire through the first adapter hole, and the first adapter hole is located on a side of the fourth via hole close to the bending region.

13. The display panel according to claim 10, wherein:

the first touch line further comprises:

a fifth part, provided in the bonding region;

the second touch line further comprises:

a sixth part, provided in the bonding region, wherein an orthographic projection of the sixth part on the base substrate at least partially overlaps with an orthographic projection of the fifth part on the base substrate;

the touch insulation layer is further provided with a second adapter hole, the second adapter hole is located in the bonding region and is provided close to the bending region, and the sixth part is connected to the connection wire through the second adapter hole.

14. The display panel according to claim 13, wherein the at least one via hole further comprises:

a fifth via hole, located in the bonding region and provided close to the bending region, wherein the sixth part is connected to the fifth part through the fifth via hole, and the second adapter hole is located on a side of the fifth via hole close to the bending region.

15. The display panel according to claim 13, wherein the display panel further comprises:

a bonding pin, located in the bonding region;

wherein the touch insulation layer is further provided with a third adapter hole, the third adapter hole is connected to the bonding pin, the sixth part is connected to the connection wire through the third adapter hole, and the bonding pin is the at least one functional structure.

16. The display panel according to claim 15, wherein the at least one via hole further comprises:

a sixth via hole, located in the bonding region and provided close to the bonding pin, wherein the sixth part is connected to the fifth part through the sixth via hole, and the sixth via hole is located on a side of the third adapter hole close to the bending region.

17. The display panel according to claim 15, wherein an extending direction of the bonding pin intersects with an extending direction of the sixth part.

18. The display panel according to claim 10, wherein the display substrate comprises:

an active layer, provided on a side of the base substrate;

a gate insulation layer, provided on a side of the active layer away from the base substrate;

a gate, provided on a side of the gate insulation layer away from the base substrate;

an interlayer dielectric layer, provided on a side of the gate away from the base substrate;

a first source-drain layer, provided on a side of the interlayer dielectric layer away from the base substrate, wherein the first source-drain layer comprises a source and a drain, and the source and the drain are electrically connected to the active layer;

a planarization layer, provided on a side of the first source-drain layer away from the base substrate;

a second source-drain layer, provided on a side of the planarization layer away from the base substrate, wherein the second source-drain layer comprises a connection structure and the connection wire, the connection structure and the connection wire are provided at intervals, and the connection structure is electrically connected to the source or the drain; and a passivation layer, provided on a side of the second source-drain layer away from the base substrate.

19. The display panel according to claim 18, wherein the display substrate further comprises:

a first electrode, provided on a side of the passivation layer away from the base substrate, wherein the first electrode is electrically connected to the connection structure;

a pixel definition layer, provided on a side of the first electrode away from the base substrate, wherein the pixel definition layer is provided with an opening part;

a light-emitting layer group, provided on a side of the pixel definition layer away from the base substrate and at least partially located within the opening part;

a second electrode, provided on a side of the light-emitting layer group away from the base substrate; and an encapsulation layer group, provided on a side of the second electrode away from the base substrate, wherein the first touch layer is provided on a side of the encapsulation layer group away from the base substrate.

20. A display device, comprising a display panel, wherein the display panel comprises a display region and a non-display region located on at least one side of the display region, and the display panel further comprises:

a base substrate;

a first touch layer, provided on a side of the base substrate, wherein the first touch layer comprises a first touch line, and the first touch line is at least partially located in the non-display region;

a touch insulation layer, provided on a side of the first touch layer away from the base substrate, wherein the touch insulation layer is provided with at least one via hole, and the via hole is at least partially located in the non-display region;

a second touch layer, provided on a side of the touch insulation layer away from the base substrate, wherein the second touch layer comprises a second touch line, the second touch line is at least partially located in the non-display region, an orthographic projection of the second touch line on the base substrate at least partially overlaps with the an orthographic projection of the first touch line on the base substrate, and the second touch line is connected to the first touch line through the via hole;

wherein, a part of the first touch line and/or the second touch line connected to at least one functional structure of the display panel forms a connection part;

the at least one functional structure comprises a touch electrode, and the touch electrode is connected to the first touch line and/or the second touch line and located in the display region;

the first touch line comprises:

a first part; and a second part, provided on a side of the first part away from the touch electrode, wherein a width of the second part is smaller than a width of the first part;

the second touch line comprises:

a third part, wherein an orthographic projection of the third part on the base substrate at least partially overlaps with an orthographic projection of the first part on the base substrate; and a fourth part, provided on a side of the third part away from the touch electrode, wherein an orthographic projection of the fourth part on the base substrate at least partially overlaps an orthographic projection of the second part on the base substrate, and a width of the fourth part is smaller than a width of the third part;

and wherein, the first part and/or the third part are connected to the touch electrode, and the third part is connected to the first part through the at least one via hole.

* * * * *